(12) United States Patent
Rothberg et al.

(10) Patent No.: US 10,591,564 B2
(45) Date of Patent: Mar. 17, 2020

(54) AUTOMATIC CONFIGURATION OF A LOW FIELD MAGNETIC RESONANCE IMAGING SYSTEM

(71) Applicant: Hyperfine Research, Inc., Guilford, CT (US)

(72) Inventors: Jonathan M. Rothberg, Guilford, CT (US); Jeremy Christopher Jordan, Cromwell, CT (US); Michael Stephen Poole, Guilford, CT (US); Laura Sacolick, Madison, CT (US); Todd Rearick, Cheshire, CT (US); Gregory L. Charvat, Guilford, CT (US)

(73) Assignee: Hyperfine Research, Inc., Guilford, CT (US)

( * ) Notice: Subject to any disclaimer, the term of this patent is extended or adjusted under 35 U.S.C. 154(b) by 829 days.

(21) Appl. No.: 15/132,742

(22) Filed: Apr. 19, 2016

(65) Prior Publication Data

US 2016/0231399 A1 Aug. 11, 2016

Related U.S. Application Data

(63) Continuation of application No. 14/846,158, filed on Sep. 4, 2015.
(Continued)

(51) Int. Cl.
*G01R 33/56* (2006.01)
*G01R 33/36* (2006.01)
(Continued)

(52) U.S. Cl.
CPC ......... *G01R 33/5608* (2013.01); *G01R 33/28* (2013.01); *G01R 33/34007* (2013.01);
(Continued)

(58) Field of Classification Search
USPC .......................... 324/300–322; 600/407–435
See application file for complete search history.

(56) References Cited

U.S. PATENT DOCUMENTS

| 3,622,869 A | 11/1971 | Golay |
| 3,735,306 A | 5/1973 | Kabler et al. |

(Continued)

FOREIGN PATENT DOCUMENTS

| CN | 1269512 A | 10/2000 |
| CN | 1394550 A | 2/2003 |

(Continued)

OTHER PUBLICATIONS

U.S. Appl. No. 14/845,652, filed Sep. 4, 2015, Rothberg et al.
(Continued)

*Primary Examiner* — Daniel R Miller
(74) *Attorney, Agent, or Firm* — Wolf, Greenfield & Sacks, P.C.

(57) ABSTRACT

In some aspects, a method of operating a magnetic resonance imaging system comprising a $B_0$ magnet and at least one thermal management component configured to transfer heat away from the $B_0$ magnet during operation is provided. The method comprises providing operating power to the $B_0$ magnet, monitoring a temperature of the $B_0$ magnet to determine a current temperature of the $B_0$ magnet, and operating the at least one thermal management component at less than operational capacity in response to an occurrence of at least one event.

17 Claims, 7 Drawing Sheets

Related U.S. Application Data

(60) Provisional application No. 62/174,666, filed on Jun. 12, 2015, provisional application No. 62/111,320, filed on Feb. 3, 2015, provisional application No. 62/110,049, filed on Jan. 30, 2015, provisional application No. 62/046,814, filed on Sep. 5, 2014.

(51) Int. Cl.

| | | |
|---|---|---|
| *G01R 33/38* | (2006.01) | |
| *G01R 33/34* | (2006.01) | |
| *G01R 33/385* | (2006.01) | |
| *G01R 33/28* | (2006.01) | |
| *G01R 33/565* | (2006.01) | |
| *G01R 33/44* | (2006.01) | |
| *G01R 33/58* | (2006.01) | |
| *G01R 33/48* | (2006.01) | |
| *H01F 7/02* | (2006.01) | |
| *H01F 7/06* | (2006.01) | |
| *G01R 33/381* | (2006.01) | |
| *G01R 33/383* | (2006.01) | |
| *G01R 33/3875* | (2006.01) | |
| *G01R 33/54* | (2006.01) | |
| *G01R 33/422* | (2006.01) | |

(52) U.S. Cl.
CPC ......... *G01R 33/36* (2013.01); *G01R 33/3614* (2013.01); *G01R 33/38* (2013.01); *G01R 33/381* (2013.01); *G01R 33/3802* (2013.01); *G01R 33/383* (2013.01); *G01R 33/3804* (2013.01); *G01R 33/385* (2013.01); *G01R 33/3806* (2013.01); *G01R 33/3852* (2013.01); *G01R 33/3854* (2013.01); *G01R 33/3856* (2013.01); *G01R 33/3858* (2013.01); *G01R 33/3875* (2013.01); *G01R 33/445* (2013.01); *G01R 33/48* (2013.01); *G01R 33/543* (2013.01); *G01R 33/546* (2013.01); *G01R 33/56* (2013.01); *G01R 33/56518* (2013.01); *G01R 33/58* (2013.01); *H01F 7/02* (2013.01); *H01F 7/06* (2013.01); *G01R 33/422* (2013.01)

(56) References Cited

U.S. PATENT DOCUMENTS

| | | | |
|---|---|---|---|
| 4,621,299 | A | 11/1986 | Hill |
| 4,638,252 | A | 1/1987 | Bradshaw |
| 4,668,915 | A | 5/1987 | Daubin et al. |
| 4,675,609 | A | 6/1987 | Danby et al. |
| 4,770,182 | A | 9/1988 | Damadian et al. |
| 4,890,061 | A | 12/1989 | Den Boef |
| 4,893,082 | A | 1/1990 | Letcher, III |
| 5,047,720 | A | 9/1991 | Guy |
| 5,252,924 | A | 10/1993 | Sakurai et al. |
| 5,483,158 | A | 1/1996 | Van Heteren et al. |
| 5,490,509 | A | 2/1996 | Carlson et al. |
| 5,877,665 | A | 3/1999 | Obasih et al. |
| 6,023,165 | A | 2/2000 | Damadian et al. |
| 6,037,850 | A * | 3/2000 | Honmei ............ G01R 33/3815 324/320 |
| 6,075,364 | A | 6/2000 | Damadian et al. |
| 6,150,820 | A | 11/2000 | Damadian et al. |
| 6,157,278 | A | 12/2000 | Katznelson et al. |
| 6,225,805 | B1 | 5/2001 | Damadian et al. |
| 6,235,409 | B1 | 5/2001 | Serafin et al. |
| 6,267,830 | B1 | 7/2001 | Groll |
| 6,288,546 | B1 | 9/2001 | Damadian et al. |
| 6,294,972 | B1 | 9/2001 | Jesmanowicz et al. |
| 6,317,618 | B1 | 11/2001 | Livni et al. |
| 6,362,620 | B1 | 3/2002 | Debbins et al. |
| 6,373,251 | B1 | 4/2002 | Damadian et al. |
| 6,400,156 | B1 | 6/2002 | Damadian et al. |
| 6,445,185 | B1 | 9/2002 | Damadian et al. |
| 6,492,812 | B1 | 12/2002 | Debbins et al. |
| 6,507,192 | B1 | 1/2003 | Damadian et al. |
| 6,522,145 | B1 | 2/2003 | Damadian et al. |
| 6,611,702 | B2 | 8/2003 | Rohling et al. |
| 6,621,267 | B1 | 9/2003 | Damadian et al. |
| 6,819,108 | B2 | 11/2004 | Huang et al. |
| 6,845,262 | B2 | 6/2005 | Albert et al. |
| 7,239,143 | B2 | 7/2007 | McBride |
| 7,345,560 | B2 | 3/2008 | Laskaris et al. |
| 7,414,401 | B1 | 8/2008 | Lvovsky |
| 7,548,061 | B2 | 6/2009 | Dewdney et al. |
| 7,659,719 | B2 | 2/2010 | Vaughan et al. |
| 7,671,587 | B2 | 3/2010 | Penanen et al. |
| 7,821,402 | B2 | 10/2010 | Yang et al. |
| 8,008,914 | B2 | 8/2011 | Penanen et al. |
| 8,049,504 | B2 | 11/2011 | Findeklee |
| 8,232,799 | B2 | 7/2012 | Hajian et al. |
| 8,335,359 | B2 | 12/2012 | Fidrich et al. |
| 8,409,807 | B2 | 4/2013 | Neely et al. |
| 8,451,004 | B2 | 5/2013 | Walsh |
| 8,487,623 | B2 | 7/2013 | Penanen et al. |
| 8,514,043 | B2 | 8/2013 | Wang et al. |
| 8,519,708 | B2 | 8/2013 | Prado et al. |
| 8,563,298 | B2 | 10/2013 | Lowery, Jr. et al. |
| 8,570,035 | B2 | 10/2013 | Wemmer et al. |
| 8,570,042 | B2 | 10/2013 | Pines et al. |
| 8,618,799 | B1 | 12/2013 | Radparvar et al. |
| 8,699,199 | B2 | 4/2014 | Blakes |
| 8,850,338 | B2 | 9/2014 | Baumgart |
| 8,852,162 | B2 | 10/2014 | Williams et al. |
| 9,500,731 | B2 | 11/2016 | Castillo |
| 9,547,057 | B2 | 1/2017 | Rearick et al. |
| 9,581,668 | B2 | 2/2017 | Waddell |
| 9,625,543 | B2 | 4/2017 | Rearick et al. |
| 9,645,210 | B2 | 5/2017 | McNulty et al. |
| 9,678,183 | B2 | 6/2017 | Bulumulla et al. |
| 9,797,971 | B2 | 10/2017 | Rearick et al. |
| 9,814,390 | B2 | 11/2017 | Piron et al. |
| 9,817,093 | B2 | 11/2017 | Rothberg et al. |
| 10,139,464 | B2 | 11/2018 | Rearick et al. |
| 10,145,913 | B2 | 12/2018 | Hugon et al. |
| 10,145,922 | B2 | 12/2018 | Rothberg et al. |
| 10,222,434 | B2 | 3/2019 | Poole et al. |
| 10,222,435 | B2 | 3/2019 | Mileski et al. |
| 10,241,177 | B2 | 3/2019 | Poole et al. |
| 2002/0050895 | A1 | 5/2002 | Zuk et al. |
| 2004/0189301 | A1 | 9/2004 | Biglieri et al. |
| 2006/0089544 | A1 | 4/2006 | Williams, Jr. et al. |
| 2006/0253020 | A1 | 11/2006 | Ehman et al. |
| 2007/0120631 | A1 | 5/2007 | Hobbs et al. |
| 2007/0216413 | A1 | 9/2007 | Legall et al. |
| 2007/0244385 | A1 | 10/2007 | Satragno et al. |
| 2007/0257800 | A1 | 11/2007 | Yang et al. |
| 2008/0084209 | A1 | 4/2008 | Seeber et al. |
| 2008/0139896 | A1 | 6/2008 | Baumgart |
| 2008/0197845 | A1 | 8/2008 | Trequattrini et al. |
| 2008/0258728 | A1 | 10/2008 | Vernickel et al. |
| 2009/0076377 | A1 | 3/2009 | Findekelee |
| 2009/0138058 | A1 | 5/2009 | Cooke et al. |
| 2010/0160817 | A1 | 6/2010 | Parihar et al. |
| 2010/0188083 | A1 * | 7/2010 | Cao .................... G01R 33/3804 324/307 |
| 2010/0219833 | A1 | 9/2010 | McGinley et al. |
| 2010/0302701 | A1 | 12/2010 | Olliges |
| 2011/0007445 | A1 | 1/2011 | Blakes |
| 2011/0025332 | A1 | 2/2011 | Abele et al. |
| 2011/0037467 | A1 | 2/2011 | Tsuda et al. |
| 2011/0060210 | A1 | 3/2011 | Ehman |
| 2011/0109311 | A1 | 5/2011 | Walsh |
| 2011/0210731 | A1 | 9/2011 | Walsh |
| 2012/0032767 | A1 | 2/2012 | Iwasaki et al. |
| 2012/0092009 | A1 | 4/2012 | Zhang et al. |
| 2012/0268117 | A1 | 10/2012 | Romano et al. |
| 2013/0116544 | A1 | 5/2013 | Rey et al. |
| 2013/0214612 | A1 | 8/2013 | Bae |
| 2014/0128722 | A1 | 5/2014 | Schweitzer et al. |
| 2014/0155732 | A1 | 6/2014 | Patz et al. |
| 2014/0232402 | A1 | 8/2014 | Tsuda |

(56) References Cited

U.S. PATENT DOCUMENTS

| | | |
|---|---|---|
| 2014/0354277 A1 | 12/2014 | Dewdney et al. |
| 2016/0069968 A1 | 3/2016 | Rothberg et al. |
| 2016/0069970 A1 | 3/2016 | Rearick et al. |
| 2016/0069971 A1 | 3/2016 | McNulty et al. |
| 2016/0069972 A1 | 3/2016 | Poole et al. |
| 2016/0069975 A1 | 3/2016 | Rothberg et al. |
| 2016/0128592 A1 | 5/2016 | Rosen et al. |
| 2016/0131727 A1 | 5/2016 | Sacolick et al. |
| 2016/0169992 A1 | 6/2016 | Rothberg et al. |
| 2016/0169993 A1 | 6/2016 | Rearick et al. |
| 2016/0223631 A1 | 8/2016 | Poole et al. |
| 2016/0231399 A1* | 8/2016 | Rothberg ............ G01R 33/3854 |
| 2016/0231402 A1 | 8/2016 | Rothberg et al. |
| 2016/0231403 A1 | 8/2016 | Rothberg et al. |
| 2016/0231404 A1 | 8/2016 | Rothberg et al. |
| 2016/0299203 A1 | 10/2016 | Mileski et al. |
| 2016/0334479 A1 | 11/2016 | Poole et al. |
| 2017/0102443 A1 | 4/2017 | Rearick et al. |
| 2017/0227616 A1 | 8/2017 | Poole et al. |
| 2017/0276747 A1 | 9/2017 | Hugon et al. |
| 2017/0276749 A1 | 9/2017 | Hugon et al. |
| 2017/0363700 A1 | 12/2017 | Gall et al. |
| 2018/0024208 A1 | 1/2018 | Rothberg et al. |
| 2018/0038931 A1 | 2/2018 | Rearick et al. |
| 2018/0088193 A1 | 3/2018 | Rearick et al. |
| 2018/0143274 A1 | 5/2018 | Poole et al. |
| 2018/0143275 A1 | 5/2018 | Sofka et al. |
| 2018/0143280 A1 | 5/2018 | Dyvorne et al. |
| 2018/0143281 A1 | 5/2018 | Sofka et al. |
| 2018/0144467 A1 | 5/2018 | Sofka et al. |
| 2018/0156881 A1 | 6/2018 | Poole et al. |
| 2018/0164390 A1 | 6/2018 | Poole et al. |
| 2018/0168527 A1 | 6/2018 | Poole et al. |
| 2018/0210047 A1 | 7/2018 | Poole et al. |
| 2018/0224512 A1 | 8/2018 | Poole et al. |
| 2018/0238978 A1 | 8/2018 | McNulty et al. |
| 2018/0238980 A1 | 8/2018 | Poole et al. |
| 2018/0238981 A1 | 8/2018 | Poole et al. |
| 2019/0004130 A1 | 1/2019 | Poole et al. |
| 2019/0011510 A1 | 1/2019 | Hugon et al. |
| 2019/0011513 A1 | 1/2019 | Poole et al. |
| 2019/0011514 A1 | 1/2019 | Poole et al. |
| 2019/0011521 A1 | 1/2019 | Sofka et al. |
| 2019/0018094 A1 | 1/2019 | Mileski et al. |
| 2019/0018095 A1 | 1/2019 | Mileski et al. |
| 2019/0018096 A1 | 1/2019 | Poole et al. |
| 2019/0025389 A1 | 1/2019 | McNulty et al. |
| 2019/0033402 A1 | 1/2019 | McNulty et al. |
| 2019/0033414 A1 | 1/2019 | Sofka et al. |
| 2019/0033415 A1 | 1/2019 | Sofka et al. |
| 2019/0033416 A1 | 1/2019 | Rothberg et al. |
| 2019/0038233 A1 | 2/2019 | Poole et al. |
| 2019/0086497 A1 | 3/2019 | Rearick et al. |

FOREIGN PATENT DOCUMENTS

| | | |
|---|---|---|
| CN | 102713465 A | 10/2012 |
| CN | 103747726 A | 4/2014 |
| EP | 1262786 A2 | 12/2002 |
| EP | 1262786 A3 | 1/2003 |
| WO | WO 2009/042131 A1 | 4/2009 |
| WO | WO 2014/013257 A1 | 1/2014 |

OTHER PUBLICATIONS

U.S. Appl. No. 15/049,309, filed Feb. 22, 2016, Rothberg et al.
U.S. Appl. No. 14/846,255, filed Sep. 4, 2015, Poole et al.
U.S. Appl. No. 15/091,971, filed Apr. 6, 2016, Poole et al.
PCT/US2015/048484, Dec. 4, 2015, International Search Report and Written Opinion.
PCT/US2015/048515, Dec. 8, 2015, International Search Report and Written Opinion.
U.S. Appl. No. 14/846,158, filed Sep. 4, 2015, Rothberg et al.
U.S. Appl. No. 15/132,617, filed Apr. 19, 2016, Rothberg et al.
U.S. Appl. No. 15/132,671, filed Apr. 19, 2016, Rothberg et al.
U.S. Appl. No. 15/132,703, filed Apr. 19, 2016, Rothberg et al.
Extended European Search Report for European Application No. 15837569.1 dated Apr. 6, 2018.
Blanco et al., Interventional and intraoperative MRI at low field scanner—a review. European Journal of Radiology, Elsevier Science. 2005;56(2):130-42.
Blumich et al., NMR at low magnetic fields. Chemical Physics Letters. 2009;477(4-6):231-40.
Danieli et al., Mobile sensor for high resolution NMR spectroscopy and imaging. Journal of Magnetic Resonance, Academic Press. 2009;198(1):80-7.
Issadore et al., Miniature magnetic resonance system for point-of-care diagnostics. Lab on a Chip. 2011;11(13):2282-7.
EP 15837569.1, Apr. 6, 2018, Extended European Search Report.
International Search Report and Written Opinion for International Application No. PCT/US2015/048470 dated Dec. 10, 2015.
International Search Report and Written Opinion for International Application No. PCT/US2015/048515 dated Dec. 8, 2015.
International Search Report and Written Opinion for International Application No. PCT/US2015/048484 dated Dec. 4, 2015.

* cited by examiner

AUTOMATIC CONFIGURATION OF A LOW FIELD MAGNETIC RESONANCE IMAGING SYSTEM

RELATED APPLICATIONS

This application claims the benefit under 35 U.S.C. § 120 and is a continuation of U.S. application Ser. No. 14/846,158, entitled "AUTOMATIC CONFIGURATION OF A LOW FIELD MAGNETIC RESONANCE IMAGING SYSTEM," filed on Sep. 4, 2015, which claims priority under 35 U.S.C. § 119(e) to U.S. Provisional Patent Application Ser. No. 62/046,814, filed Sep. 5, 2014 and entitled "Low Field Magnetic Resonance Imaging Methods and Apparatus," U.S. Provisional Patent Application Ser. No. 62/111,320, filed Feb. 3, 2015 and entitled "Thermal Management Methods and Apparatus," U.S. Provisional Patent Application Ser. No. 62/110,049, filed Jan. 30, 2015 and entitled "Noise Suppression Methods and Apparatus," and U.S. Provisional Patent Application Ser. No. 62/174,666, filed Jun. 12, 2015 and entitled "Automatic Configuration of a Low Field Magnetic Resonance Imaging System," each of which is herein incorporated by reference in its entirety.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to MRI that, for a given imaging application, may involve the relatively high cost of the equipment, limited availability and/or difficulty in gaining access to clinical MRI scanners and/or the length of the image acquisition process.

The trend in clinical MRI has been to increase the field strength of MRI scanners to improve one or more of scan time, image resolution, and image contrast, which, in turn, continues to drive up costs. The vast majority of installed MRI scanners operate at 1.5 or 3 tesla (T), which refers to the field strength of the main magnetic field $B_0$. A rough cost estimate for a clinical MRI scanner is on the order of one million dollars per tesla, which does not factor in the substantial operation, service, and maintenance costs involved in operating such MRI scanners.

Additionally, conventional high-field MRI systems typically require large superconducting magnets and associated electronics to generate a strong uniform static magnetic field ($B_0$) in which an object (e.g., a patient) is imaged. The size of such systems is considerable with a typical MRI installment including multiple rooms for the magnet, electronics, thermal management system, and control console areas. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but due to one or more of the limitations discussed above, is not practical or is impossible, as discussed in further detail below.

SUMMARY

Low-field MRI presents an attractive imaging solution, providing a relatively low cost, high availability alternative to high-field MRI. The inventors have recognized that characteristics of low-field MRI facilitate the implementation of substantially smaller and/or more flexible installations that can be deployed in wide variety of circumstances and facilities, and further allow for the development of portable or cartable low-field MRI systems. Because such systems may be operating in different environments at different times and/or because such systems may be operated in generally uncontrolled environments (e.g., low-field MRI systems may be operated outside specially shielded rooms in which high-field MRI systems typically operate), it may be advantageous to provide "in-field" and/or dynamic calibration of one or more components of the MRI system to adjust or optimize the system for the environment in which the system is located. According to some embodiments, automated techniques are provided to modify or adjust one or more aspects of an MRI system based on environmental and/or operating conditions of the system, as discussed in further detail below. According to some embodiments, automated techniques are provided that facilitate ease of use of the low-field MRI system, thus enabling use by users/operators having a wider range of training and/or expertise, including no specialized training or expertise at all.

Some embodiments include a method of operating a magnetic resonance imaging system comprising a $B_0$ magnet and at least one thermal management component configured to transfer heat away from the $B_0$ magnet during operation, the method comprising providing operating power to the $B_0$ magnet, monitoring a temperature of the $B_0$ magnet to determine a current temperature of the $B_0$ magnet, and operating the at least one thermal management component at less than operational capacity in response to an occurrence of at least one event.

Some embodiments include a magnetic resonance imaging system, comprising a $B_0$ magnet configured to provide at least a portion of a $B_0$ field at least one thermal management component configured to transfer heat away from the $B_0$ magnet during operation, and at least one processor programmed to monitor a temperature of the $B_0$ magnet to determine a current temperature of the $B_0$ magnet, and operate the at least one thermal management component at less than operational capacity in response to an occurrence of at least one event.

Some embodiments include a method of dynamically adjusting a $B_0$ field produced by a magnetic resonance imaging system, the method comprising detecting a first magnetic field produced by a $B_0$ magnet that contributes to the $B_0$ field, and selectively operating at least one shim coil to produce a second magnetic field based on the detected first magnetic field to adjust the $B_0$ field produced by the magnetic resonance imaging system.

Some embodiments include a magnetic resonance imaging system, comprising a $B_0$ magnet configured to provide a first magnetic field that contributes to a $B_0$ field, a plurality of shim coils, at least one sensor arranged to detect the first magnetic field when the $B_0$ magnet is operated, and at least one controller configured to selectively operate at least one of the plurality of shim coils to produce a second magnetic field based on the first magnetic field detected by the at least one sensor to adjust the $B_0$ field produced by the magnetic resonance imaging system.

Some embodiments include a method of degaussing subject matter proximate a magnetic resonance imaging system comprising a $B_0$ magnet configured to provide, at least in part, a $B_0$ field, the method comprising operating the $B_0$ magnet with a first polarity, and periodically operating the $B_0$ magnet with a second polarity opposite the first polarity.

Some embodiments include a magnetic resonance imaging system configured to degauss proximate subject matter, the magnetic resonance imaging system comprising a $B_0$ magnet configured to provide, at least in part, a $B_0$ field, and a controller configured to operate the $B_0$ magnet with a first polarity, and to periodically operate the $B_0$ magnet with a second polarity opposite the first polarity.

Some embodiments include a method of dynamically configuring a magnetic resonance imaging system for use in an arbitrary environment, the method comprising identifying at least one impediment to performing magnetic resonance imaging, and automatically performing at least one remedial action based, at least in part, on the identified at least one impediment.

Some embodiments include a method of configuring a magnetic resonance imaging system having a component to which radio frequency coils of different types can be operatively coupled, the method comprising detecting whether a radio frequency coil is operatively coupled to the component of the magnetic resonance imaging system, determining information about the radio frequency coil in response to determining that the radio frequency coil is operatively coupled to the magnetic resonance imaging system, and automatically performing at least one action to configure the magnetic resonance imaging system to operate with the radio frequency coil based, at least in part, on the information about the radio frequency coil.

Some embodiments include a magnetic resonance imaging system comprising a B0 magnet configured to provide at least a portion of a B0 field, a component to which radio frequency coils of different types can be operatively coupled, and at least one controller configured to detect whether a radio frequency coil is operatively coupled to the component of the magnetic resonance imaging system, determine information about the radio frequency coil in response to determining that the radio frequency coil is operatively coupled to the magnetic resonance imaging system, and automatically perform at least one action to configure the magnetic resonance imaging system to operate with the radio frequency coil based, at least in part, on the information about the radio frequency coil.

Some embodiments include a method of operating a low-field magnetic resonance imaging system comprising at least one communication interface that allows the magnetic resonance imaging system to communicate with one or more external computing devices, the method comprising initiating, by at least one processor of the low-field magnetic resonance imaging system, a connection with at least one external computing device, and exchanging information with the at least one external computing device using the at least one processor.

Some embodiments include a low-field magnetic resonance imaging system comprising at least one magnetic component configured for operation at low field, at least one communication interface that allows the low-field magnetic resonance imaging system to communicate with one or more external computing devices, and at least one processor configured to initiate a connection with at least one external computing device, and exchange information with the at least one external computing device using the at least one processor.

Some embodiments include a method of assisting in the automatic setup of a magnetic resonance imaging system, the method comprising detecting a type of radio frequency coil connected to the magnetic resonance imaging system and/or a position of a patient support, and automatically performing at least one setup process based, at least in part, on the type of radio frequency coil detected and/or the position of the patient support.

BRIEF DESCRIPTION OF THE DRAWINGS

Various aspects and embodiments of the disclosed technology will be described with reference to the following figures. It should be appreciated that the figures are not necessarily drawn to scale.

DETAILED DESCRIPTION

Figure 1:
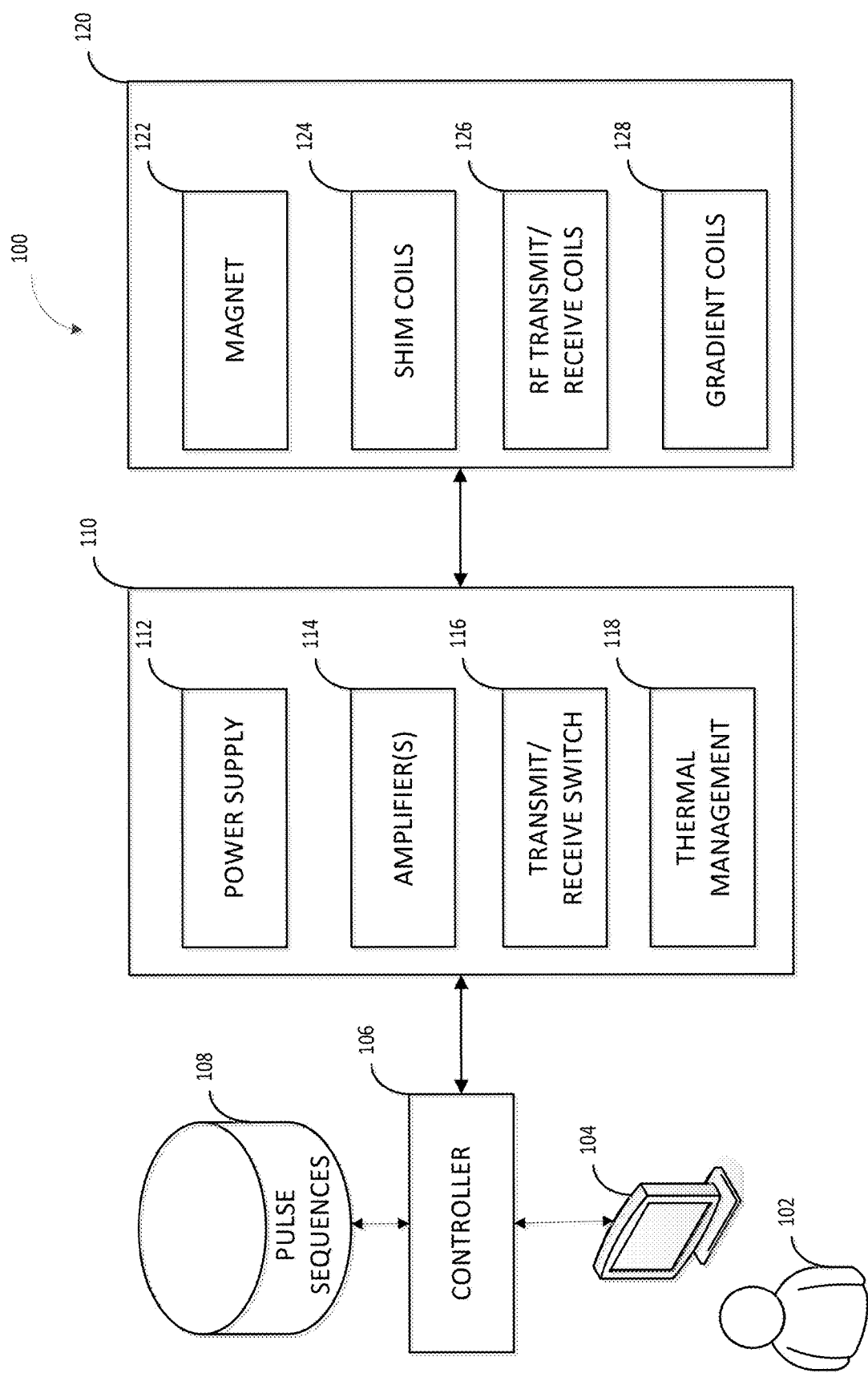
FIG. 1 is a schematic illustration of a low-field MRI system that may be automatically configured in accordance with the techniques described herein.

The MRI scanner market is overwhelmingly dominated by high-field systems, and is exclusively so for medical or clinical MRI applications. As discussed above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a B0 field) at or above 1.5 T, though clinical systems operating between 0.5 T and 1.5 T are generally also considered "high-field." By contrast, "low-field" refers generally to MRI systems operating with a B0 field of less than or equal to approximately 0.2 T. The appeal of high-field MRI systems include improved resolution and/or reduced scan times compared to lower field systems, motivating the push for higher and higher field strengths for clinical and medical MRI applications.

The inventors have developed techniques for producing improved quality, portable and/or lower-cost low-field MRI systems that can improve the wide-scale deployability of MRI technology in a variety of environments including, but also beyond, installments at hospitals and research facilities. For example, in addition to hospitals and research facilities, low-field MRI systems may be deployed in offices, clinics, multiple departments within a hospital (e.g., emergency rooms, operating rooms, radiology departments, etc.), either as permanent or semi-permanent installations or deployed as mobile/portable/cartable systems that can be transported to desired locations.

The inventors have recognized that widespread deployment of such low-field MRI systems presents challenges in ensuring that the MRI system performs suitably in any environment in which the system is operated. Manually configuring parameters of the low-field MRI system for a particular environment and/or application is cumbersome and often requires technical expertise typical users of the low-field MRI system may not have. Additionally, properties of the environment that may be important to operation of the system may not be ascertainable or otherwise obtainable by a human operator.

Accordingly, some embodiments are directed to techniques for automatically configuring a low-field MRI system based, at least in part, on environmental and/or operational condition of the low-field MRI system. Techniques for automatic configuration may be performed upon powering on of the system, in response to detecting one or more changes in environmental and/or operating conditions, or at any other suitable time, as discussed in more detail below. Some aspects are directed to an automatic setup process for a low-field MRI system in which component(s) of the system are automatically configured based, at least in part, on environmental and/or operating conditions in which the low-field MRI system is operated. Some aspects are directed to dynamically configuring an MRI system in view of changing environmental and/or operating conditions. Some aspects or directed to automatic techniques for adjusting the operation of the system based on an operating mode of the system (e.g., low power mode, warm-up, idle, etc.).

Additionally, as discussed above, increasing the field strength of MRI systems yields increasingly more expensive and complex MRI scanners, thus limiting availability and preventing their use as a general purpose and/or generally available imaging solution. The relatively high cost, complexity, and size of high-field MRI primarily restricts their use to dedicated facilities. Moreover, conventional high-field MRI systems are typically operated by technicians that have had extensive training on the system to be able to produce desired images. The requirement that highly trained technicians be present to operate high-field MRI systems further contributes to the limited availability of high-field MRI and to the inability of high-field MRI to be employed as a widely available and/or general purpose imaging solution.

The inventors have recognized that ease of use may be a substantial contributing factor in allowing low-field MRI systems to be widely available, deployed and/or used in a variety of circumstances and environments. To this end, the inventors have developed automatic, semi-automatic and/or assisted setup techniques that facilitate simple and intuitive use of the low-field MRI system. As a result, the amount of training needed to operate such a low-field MRI system may be substantially reduced, increasing the situations in which the low-field MRI system can be employed to perform desired imaging applications.

Following below are more detailed descriptions of various concepts related to, and embodiments of, methods and apparatus for low field magnetic resonance applications including low-field MRI. It should be appreciated that various aspects described herein may be implemented in any of numerous ways. Examples of specific implementations are provided herein for illustrative purposes only. In addition, various aspects described in the embodiments below may be used alone or in any combination, and are not limited to the combinations explicitly described herein. While some of the techniques described herein were designed, at least in part, to address challenges associated with low-field and/or portable MRI, these techniques are not limited in this respect and can be applied to high-field MRI systems, as the aspects are not limited for use with any particular type of MRI system.

FIG. 1 is a block diagram of exemplary components of a low-field MRI system 100. In the illustrative example of FIG. 1, low-field MRI system 100 comprises workstation 104, controller 106, pulse sequences repository 108, power management system 110, and magnetics components 120. It should be appreciated that system 100 is illustrative and that a low-field MRI system may have one or more other components of any suitable type in addition to or instead of the components illustrated in FIG. 1.

As illustrated in FIG. 1, magnetics components 120 comprises magnet 122, shim coils 124, RF transmit/receive coils 126, and gradient coils 128. Magnet 122 may be used to generate the main magnetic field $B_0$. Magnet 122 may be any suitable type of magnet that can generate a main magnetic field having low-field strength (i.e., a magnetic field having a strength of 0.2 Tesla or less). Shim coils 124 may be used to contribute magnetic field(s) to improve the homogeneity of the $B_0$ field generated by magnet 122. Gradient coils 128 may be arranged to provide gradient fields and, for example, may be arranged to generate gradients in the magnetic field in three substantially orthogonal directions (X, Y, Z).

RF transmit/receive coils 126 comprise one or more transmit coils that may be used to generate RF pulses to induce an oscillating magnetic field $B_1$. The transmit coil(s) may be configured to generate any suitable types of RF pulses useful for performing low-field MR imaging. In some embodiments, suitable types of RF pulses useful for performing low-field MR imaging may be selected, at least in part, on environmental conditions, as discussed in more detail below.

Each of magnetics components 120 may be constructed in any suitable way. For example, in some embodiments, one or more of magnetics components 120 may be fabricated using techniques described in the co-filed U.S. Application under Ser. No. 14/845,652, titled "Low Field Magnetic Resonance Imaging Methods and Apparatus," filed Sep. 4, 2015, which is herein incorporated by reference in its entirety.

Power management system 110 includes electronics to provide operating power to one or more components of the low-field MRI system 100. For example, as discussed in more detail below, power management system 110 may include one or more power supplies, gradient power amplifiers, transmit coil amplifiers, and/or any other suitable power electronics needed to provide suitable operating power to energize and operate components of the low-field MRI system 100.

As illustrated in FIG. 1, power management system 110 comprises power supply 112, amplifier(s) 114, transmit/receive switch 116, and thermal management components 118. Power supply 112 includes electronics to provide operating power to magnetic components 120 of the low-field MRI system 100. For example, power supply 112 may include electronics to provide operating power to one or more $B_0$ coils (e.g., $B_0$ magnet 122) to produce the main magnetic field for the low-field MRI system. In some embodiments, power supply 112 is a unipolar, continuous wave (CW) power supply, however, any suitable power supply may be used. Transmit/receive switch 116 may be used to select whether RF transmit coils or RF receive coils are being operated.

Amplifier(s) 114 may include one or more RF receive (Rx) pre-amplifiers that amplify MR signals detected by one or more RF receive coils (e.g., coils 124), one or more RF transmit (Tx) amplifiers configured to provide power to one or more RF transmit coils (e.g., coils 126), one or more gradient power amplifiers configured to provide power to one or more gradient coils (e.g., gradient coils 128), shim amplifiers configured to provide power to one or more shim coils (e.g., shim coils 124).

Thermal management components 118 provide cooling for components of low-field MRI system 100 and may be configured to do so by facilitating the transfer of thermal energy generated by one or more components of the low-field MRI system 100 away from those components. Thermal management components 118 may include, without limitation, components to perform water-based or air-based cooling, which may be integrated with or arranged in close proximity to MRI components that generate heat including, but not limited to, $B_0$ coils, gradient coils, shim coils, and/or transmit/receive coils. Thermal management components 118 may include any suitable heat transfer medium including, but not limited to, air and water, to transfer heat away from components of the low-field MRI system 100. Thermal management component may, for example, be any of the thermal management components and/or techniques described in co-filed U.S. Application under Ser. No. 14/846,042, titled "Thermal Management Methods and Apparatus," filed Sep. 4, 2015, which is herein incorporated by reference in its entirety.

As illustrated in FIG. 1, low-field MRI system 100 includes controller 106 (also referred to herein as a "console") having control electronics to send instructions to and receive information from power management system 110. Controller 106 may be configured to implement one or more pulse sequences, which are used to determine the instructions sent to power management system 110 to operate one or more of magnetic components 120 in a desired sequence. Controller 106 may be implemented as hardware, software, or any suitable combination of hardware and software, as aspects of the disclosure provided herein are not limited in this respect.

In some embodiments, controller 106 may be configured to implement a pulse sequence by obtaining information about the pulse sequence from pulse sequences repository 108, which stores information for each of one or more pulse sequences. Information stored by pulse sequences repository 108 for a particular pulse sequence may be any suitable information that allows controller 106 to implement the particular pulse sequence. For example, information stored in pulse sequences repository 108 for a pulse sequence may include one or more parameters for operating magnetics components 120 in accordance with the pulse sequence (e.g., parameters for operating the RF transmit/receive coils 126, parameters for operating gradient coils 128, etc.), one or more parameters for operating power management system 110 in accordance with the pulse sequence, one or more programs comprising instructions that, when executed by controller 106, cause controller 106 to control system 100 to operate in accordance with the pulse sequence, and/or any other suitable information. Information stored in pulse sequences repository 108 may be stored on one or more non-transitory storage media.

As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 to facilitate the processing of MR data by the computing device. For example, controller 106 may provide information about one or more pulse sequences to computing device 104 and the computing device may perform an image reconstruction process based, at least in part, on the provided information.

Computing device 104 may be any electronic device configured to process acquired MR data and generate one or more images of a subject being imaged. In some embodiments, computing device 104 may be a fixed electronic device such as a desktop computer, a server, a rack-mounted computer, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged. In some embodiments, computing device 104 may comprise multiple computing devices of any suitable type, as aspects of the disclosure provided herein are not limited in this respect. A user 102 may interact with computing device 104 to control aspects of the low-field MR system 100 (e.g., program the system 100 to operate in accordance with a particular pulse sequence, adjust one or more parameters of the system 100, etc.) and/or view images obtained by the low-field MR system 100.

Figure 2B:
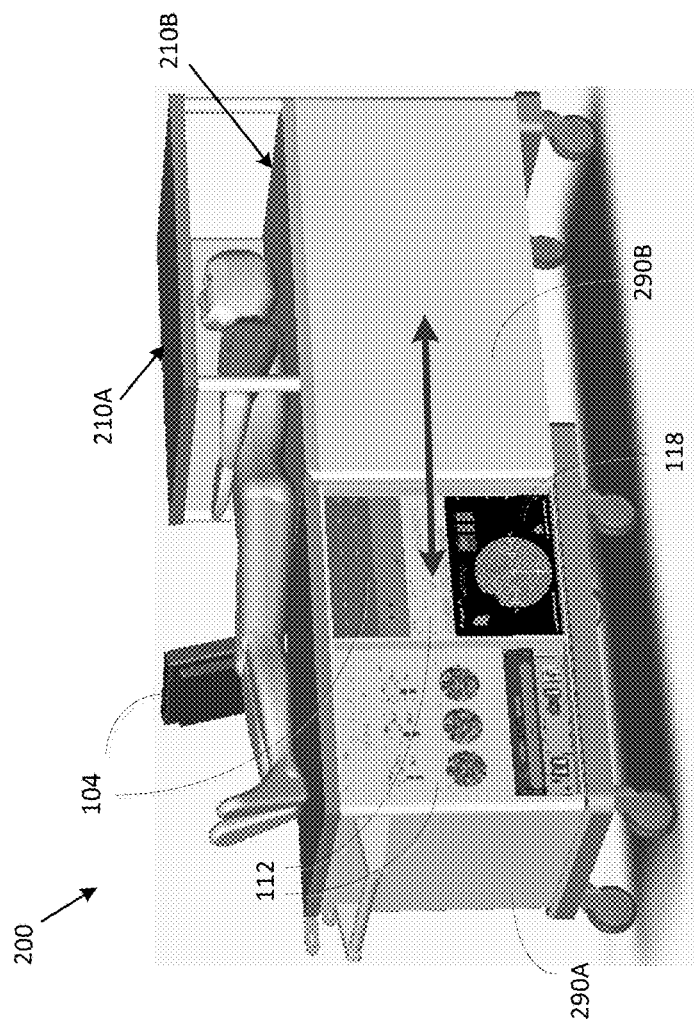
FIGS. 2A and 2B are an illustration of a portable low-field MRI system, in accordance with some embodiments.
Figure 2A:
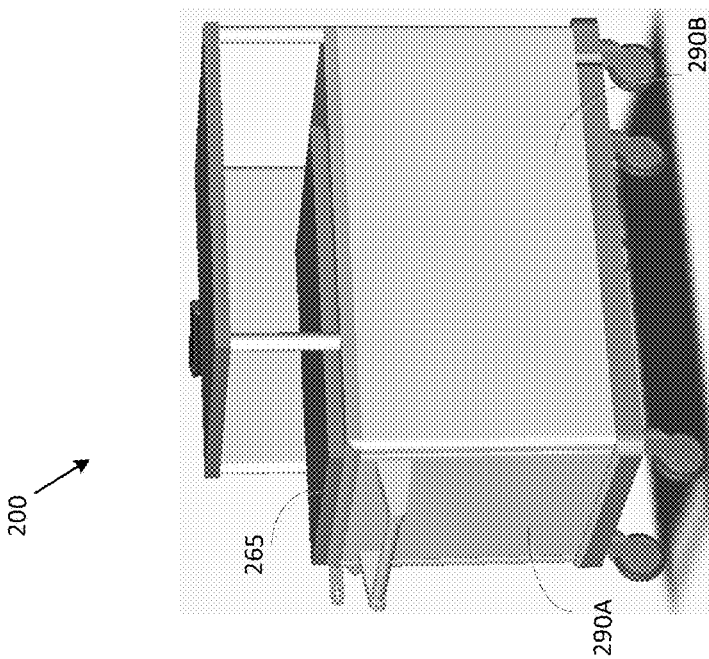

FIGS. 2A and 2B illustrate a portable or cartable low-field MRI system 200, in accordance with some embodiments. System 200 may include one or more of the components described above in connection with FIG. 1. For example, system 200 may include magnetic and power components, and potentially other components (e.g., thermal management, console, etc.), arranged together on a single generally transportable and transformable structure. System 200 may be designed to have at least two configurations; a configuration adapted for transport and storage, and a configuration adapted for operation. FIG. 2A shows system 200 when secured for transport and/or storage and FIG. 2B shows system 200 when transformed for operation. System 200 comprises a portion 290A that can be slid into and retracted from a portion 290B when transforming the system from its transport configuration to its operation configuration, as indicated by the arrows shown in FIG. 2B. Portion 290A may house power electronics 110, console 106 (which may comprise an interface device such as the touch panel display illustrated in FIGS. 2A and 2B) and thermal management 118. Portion 290A may also include other components used to operate system 200 as needed.

Portion 290B includes magnetic components 120 of low-field MRI system 200, including laminate panels 210A and 210B on which one or more magnetic components (e.g., magnet 112, shim coils 124, RF transmit/receive coils 126, gradient coils 128) are integrated in any combination. When transformed to the configuration adapted for operating the system to perform MRI (as shown in FIG. 2B), supporting surfaces of portions 290A and 290B provide a surface on which a subject to be imaged can lie. A slideable surface 265 may be provided to facilitate sliding the subject into position so that a portion of the subject is within the field of view of the laminate panels providing corresponding low-field MRI magnets. System 200 provides for a portable compact configuration of a low-field MRI system that facilitates access to MRI imaging in circumstances where it conventionally is not available (e.g., in an emergency room).

Figure 2C:
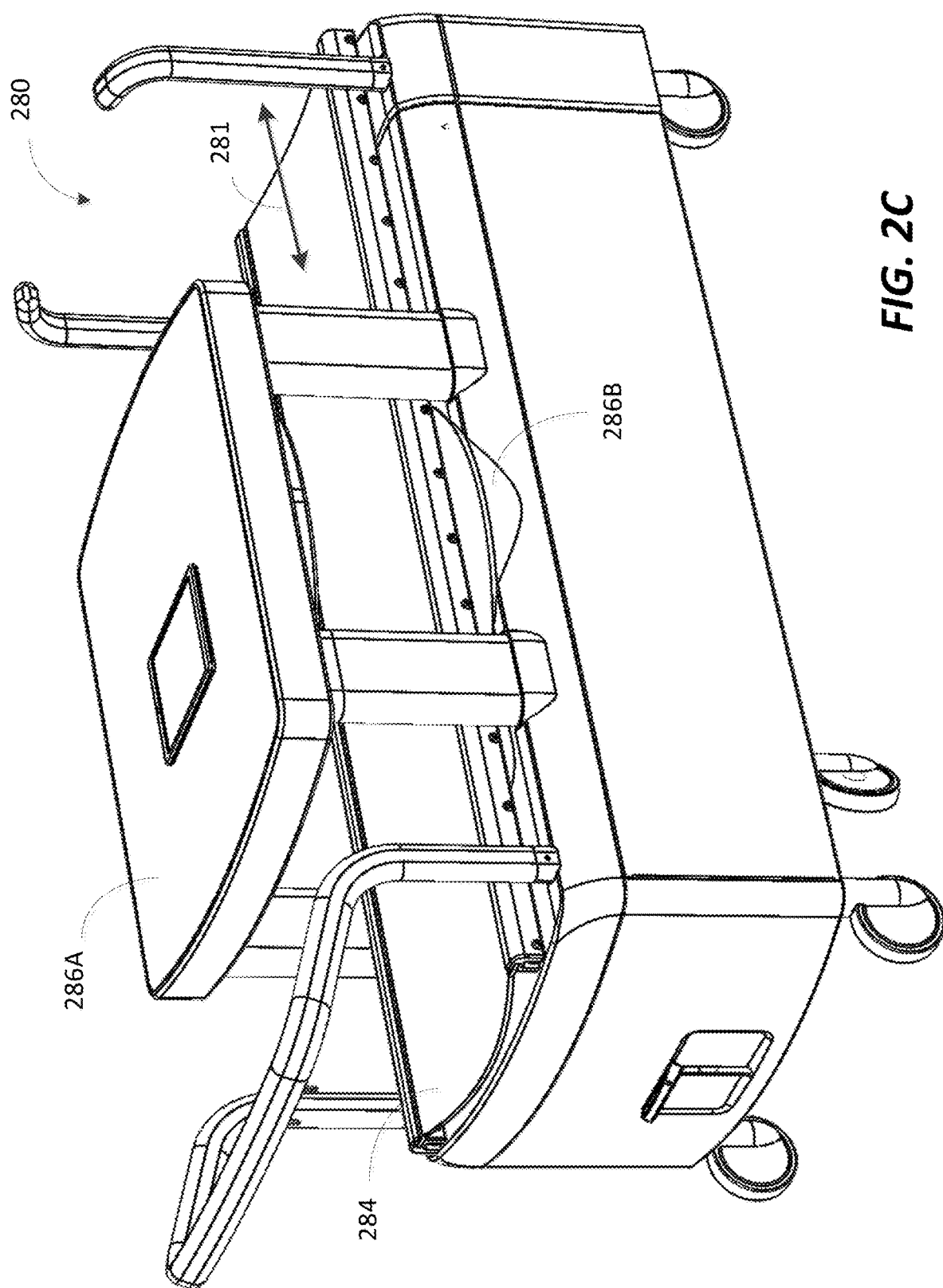
FIGS. 2C and 2D are an illustration of a transportable low-field MRI system, in accordance with some embodiments.
Figure 2D:
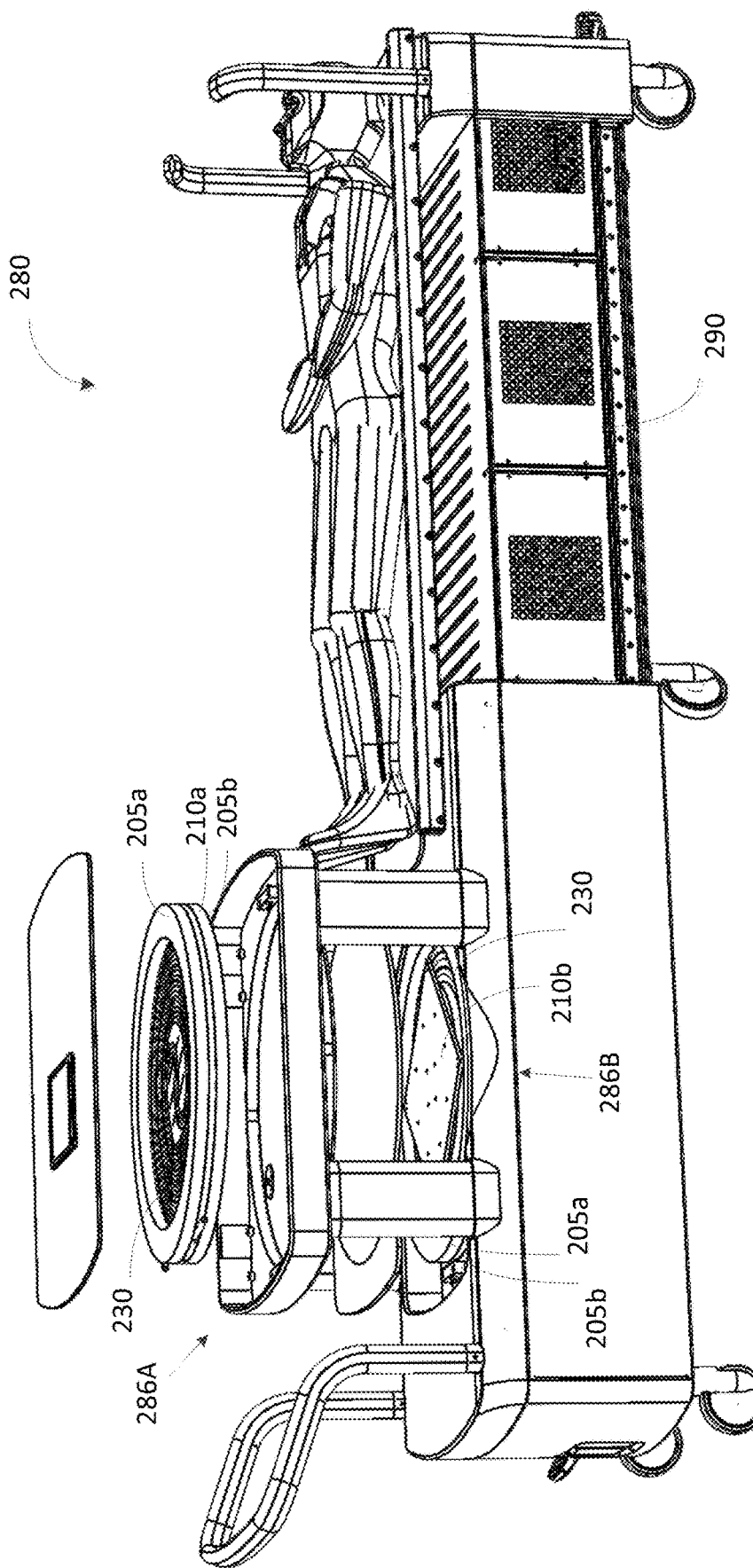

FIGS. 2C and 2D illustrate another generally transportable low-field MRI system, in accordance with some embodiments. FIG. 21C illustrates an example of a convertible low field MRI system 280 that utilizes a bi-planar hybrid magnet, in accordance with some embodiments. In FIG. 2C, the convertible system is in a collapsed configuration convenient for transporting the system or storing the system when it is not in use. Convertible system 280 includes a slide-able bed 284 configured to support a human patient and to allow the patient to be slid into and out from the imaging region between housings 286A and 286B in the direction of arrows 2281. Housings 286A and 286B house magnetic components for the convertible system 280 to produce magnetic fields for performing MRI. According to some embodiments, the magnetic components may be produced, manufactured and arranged using exclusively laminate techniques, exclusively using traditional techniques, or using a combination of both (e.g., using hybrid techniques).

FIG. 2D illustrates convertible system 280 extended and with a patient positioned on slide-able bed 284 prior to being inserted between housings 286A and 286B to be imaged. According to some embodiments, each of housings 286A and 286B house a hybrid magnet coupled to a thermal management component to draw heat away from the magnetic components. Specifically, each of housings 286A and 286B on opposing sides of the imaging region include therein B0 coils 205a and 205b, laminate panel 210 (210b of which is visible within housing 286B in the face-up arrangement) and thermal management component 230 provided between the B0 coils. The magnetic components housed in 286A and 286B may be substantially identical to form a symmetric bi-planar hybrid magnet, or the magnetic components house in 286A and 286B may be different to form an asymmetric bi-planar hybrid magnet, as the aspects are not limited for use with any particular design or construction of a hybrid magnet.

In accordance with the techniques described herein, one or more components of low-field MRI system (e.g., system 100, 200 and/or 280) are automatically configured to ensure that the system will perform or is performing properly during operation. As discussed above, such an MRI system may be operated in a variety of environments requiring one or more parameters of the system to be adjusted to ensure satisfactory operation in a given environment. As also discussed above, manual configuration of components of a low-field MRI system is cumbersome and requires expertise that many users of the MRI system may not have. In many instances, the environmental and/or operating condition to which a system needs to adjust or adapt may not be ascertainable to a human operator (e.g., radio frequency noise or other electromagnetic interference (EMI), unintentional short or open circuits, mis-aligned components, etc.) so that appropriate adjustment to the system is not possible, even for an expert. Accordingly, some embodiments are configured to automatically perform a set of configuration and/or setup operations in response to the occurrence of a particular event (e.g., powering on the low-field MRI system, waking-up from a sleep mode or a low-power mode, detection of changing environmental conditions, etc.).

Figure 3:
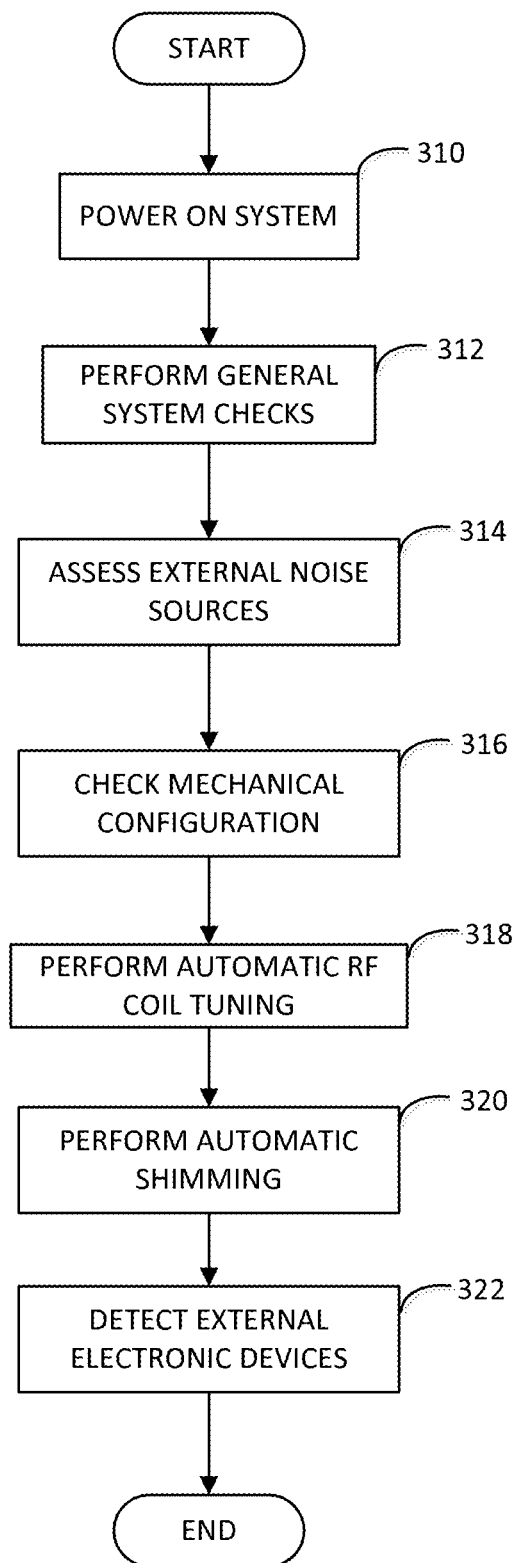
FIG. 3 is a flowchart of a process for automatically configuring a low-field MRI system in accordance with some embodiments.

FIG. 3 illustrates an automatic configuration process that may be performed in response to the occurrence of an event in accordance with some embodiments. It should be appreciated that while FIG. 3 illustrates a number of configuration or setup operations that may be performed, any one or combination of operations may be performed, as the aspects are not limited in this respect. Additionally, although the exemplary configuration operations shown in FIG. 3 are shown as being performed in series, it should be appreciated that one or more configuration operations may be performed partially or completely in parallel, and there are no limitations on which and/or when particular configuration operations are performed.

Figure 4:
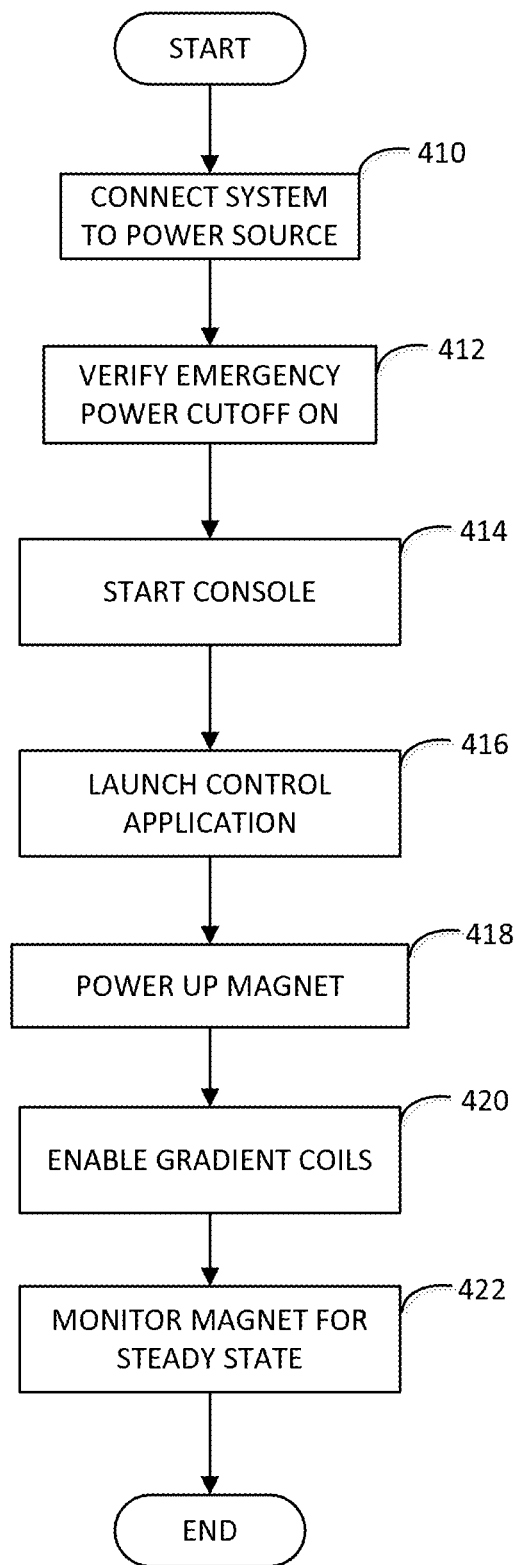
FIG. 4 is a flowchart of a process for powering up a low-field MRI system in accordance with some embodiments.

In act 310, the low-field MRI system is powered on. FIG. 4 illustrates a power on process that may be performed in act 310 in accordance with some embodiments. It should be appreciated that while FIG. 4 illustrates a number of power-up operations that may be performed, any one or combination of operations may be performed, as the aspects are not limited in this respect. Additionally, although the exemplary configuration operations shown in FIG. 4 are shown as being performed in series, it should be appreciated that one or more configuration operations may be performed partially or completely in parallel, and there are no limitations on which and/or when particular configuration operations are performed.

In act 410, the low-field MRI system is connected to a power source. For example, the low-field MRI system may be connected to a standard wall outlet, connected to an external power supply such as a generator, or connected to any other suitable type of power source for providing operating power to components of the low-field MRI system. In act 412, it is verified that the emergency power cutoff is operational. Patient safety is a primary consideration when designing medical devices. Accordingly, some low-field MRI systems used in accordance with the techniques described herein include an emergency power cutoff that may be manually or automatically triggered in situations (e.g., overheating of the magnet) where patient safety may be a concern. Thus, to ensure safe operation, the system may check to confirm that any and all power cutoff (or other safety mechanisms) are enabled and/or operational.

In act 414, the console 104 is powered on by, for example, a user pressing a power switch, button or other mechanism on the console. In response to being powered on, the console may execute a number of startup processes prior to launching a control application used to control one or more operations of the low-field MRI system. After or during execution of any startup processes, a control application configured to control one or more operations of the low-field MRI system is launched on the console (act 416). The control application may be launched automatically upon power on of the console or in response to a user interaction with the console or an external electronic device configured to interact with the console, as discussed in more detail below. In response to the control application being launched the application may instruct the console to perform one or more operations including, but not limited to, instructing power supply 112 to turn on system DC power.

After or during launch of the control application, other components of the low-field MRI system may be enabled and/or configured. For example, in act 418, the control application may instruct power supply 112 to power up magnet 122 by warming up the magnet to a temperature wherein the resulting $B_0$ field is suitable for imaging, for example, to perform low-field MRI. In some implementations, the process of warming up the magnet may take a considerable amount of time (e.g., 30 minutes) to provide a stable $B_0$ field suitable for imaging. To reduce the amount of time needed to warm up the magnet 122, some embodiments perform one or more "pre-heating" operations. For example, one or more of thermal management components 118 that, during operation of the low-field MRI system, transfer heat away from magnetic components 120 of the low-field MRI system, may be turned down or turned off to allow the magnet to warm up faster than if the thermal management components were operating normally. In some implementations, thermal management components 118 includes air or water cooling systems (e.g., fans and/or pumps) to provide cooling of the magnetics components of the low-field MRI system. During pre-heating of the magnet, the fans and/or pumps may be turned off or turned down (e.g., by decreasing the cooling capacity or intensity) to expedite the magnet warm up process. Operating one or more thermal management components at less than operation capacity refers herein to intentionally adjusting the one or more thermal management components so that the capacity to remove heat is reduced from its normal operation, including by not operating the one or more thermal management components at all.

In embodiments that modify the operation of thermal management components 118, the temperature of the magnet should be closely monitored to ensure that the magnet does not overheat and/or to determine when to turn on or increase the capacity/intensity of the thermal management components. The temperature of the magnet may be determined in any suitable way including, but not limited to, using a temperature sensor, determining the temperature of the magnet based, at least in part, on a measured voltage of the magnet, etc. According to some embodiments, temperature sensing (e.g., via sensors and/or voltage measurements) is provided to automate control of thermal management to expedite warming and to engage and/or increase the cooling intensity as the magnet approaches thermal equilibrium or suitable B0 field stability.

Some embodiments include a low-power mode for use when the system is idle (e.g., not being used for imaging) to keep the magnet warm. For example, in a low power mode, less current may be provided to the magnet while still allowing magnet 112 to remain at a temperature acceptable for imaging. The low-power mode may be implemented in any suitable way that enables the magnet to remain at a desired temperature. For example, one or more of the techniques described above for reducing the warm-up time of the magnet (e.g., turning off or down one or more thermal management components) may also be used to place the low-field MRI system into low-power mode. Thus, while not in use, the magnet can stay warm with less power so that, when needed, the magnet is ready without needing a warm-up period. In some embodiments, operation in low-power mode may be automatically initiated when the low-field MRI system 100 has not been in operation for a particular amount of time and/or low power mode may be initiated manually via a switch, button or other interface mechanism provided by the system.

Alternatively, low-power mode may be used in response to determining that an ambient temperature of the environment in which the low-field MRI system 100 is operating is above a particular temperature. For example, if the low-field MRI system is deployed in a high-temperature environment (e.g., a desert), operation of the magnet in a normal operating mode may not be possible due to the likelihood of the magnet overheating. However, in such situations, the MRI system 100 may still be able to operate in low-power mode by driving the magnet with less current than would be used in environments with lower temperatures. Accordingly, such a low-power mode enables use of low-field MRI systems in challenging environments that ordinarily would be unsuitable for MRI systems to operate.

In some embodiments, the time required to perform warm up of the magnet prior to imaging may be reduced by determining and compensating for fluctuations in low-field MRI parameters during the warm up process to enable imaging before the fluctuations have stabilized. For example, the Larmor frequency of the $B_0$ magnet often fluctuates as the magnet warms up and becomes stable. Some embodiments characterize how the Larmor frequency tracks with voltage (or temperature) of the magnet, and compensates for the changes in frequency to allow for imaging before the magnet reaches its normal operating temperature. The homogeneity of the $B_0$ field is another parameter known to fluctuate during warm up of the magnet. Accordingly, some embodiments characterize how the $B_0$ field homogeneity tracks voltage (or temperature) of the magnet, and compensates for the changes in field homogeneity (e.g., using one or more shim coils) to enable imaging before the field homogeneity reaches normal operating levels. Other low-field MRI parameters that fluctuate during warm up of magnet 112 may also be tracked and compensated for to provide for imaging with the low-field MRI system prior to the magnet reaching thermal equilibrium and/or field stability, provided that the fluctuations in these parameters may be characterized by measuring a voltage (or temperature) of the magnet, or some other parameter of the low-field MRI system.

Returning to the process of FIG. 4, in act 420, the gradient coils are enabled. The inventors have recognized that, in some embodiments, the process of enabling the gradient coils may be delayed until shortly before imaging is ready to proceed to reduce the power consumption of the low-field MRI system. After the low-field MRI system is operational, act 422 may be performed to monitor one or more properties of the magnet to ensure that the magnet remains in a state suitable for operation. If it is detected that one or more properties of the magnet have drifted or otherwise changed in a manner that impacts the ability to acquire satisfactory images, one or more remedial actions may be performed.

Returning to the process of FIG. 3, in act 312, one or more general system checks are performed to ensure the proper operation of the low-field MRI system 100. For example, the general system checks may include checking whether magnet 112 is shorted or open. Shorting of magnet 112 may occur for any of a number of reasons. Thermal contraction and expansion (thermal cycling) of various components of the low-field MRI system, for example, during normal operational use and/or as a result of operation in different environments may result in shorting of magnet 112, or a portion thereof, or any of various other circuitry, coils, etc. of the MRI system. For example, thermal cycling may cause otherwise isolated conductive material to come into contact to short circuitry (e.g., windings in a coil) of the system. For example, a conductive (e.g., aluminum) surface of a cold plate included as a component of thermal management system 118, may in some cases, contact conductive material of one or more coils being cooled to cause shorting of coil. Some embodiments test the system (e.g., magnet 112) to determine whether there is a short, and if so, an alert may be provided to the user that the system is not operational and needs to be serviced. A short may be detected by monitoring the current-voltage (IV) curve resulting from powering one or more components to evaluate whether the IV curve responds as expected, or by using any other suitable technique.

According to some embodiments, the system detects for an open circuit. For example, any number of factors may cause a magnet 112 (or any other system circuitry) to open, thereby not allowing current to flow. Open circuits can be caused by thermal cycling and/or through use of the system, for example, by separating electrical connections or by having components come loose (e.g., dislodged bolts or screws used to connect components of the low-field MRI system 100). For example, thermal cycling of the magnet may contribute to the loosening of bolts/screws in the magnet assembly, which may cause the magnet to have an open circuit. Some embodiments test magnet 112 to determine whether it is open (e.g., by observing whether applying a voltage draws a current), and if so, an alert may be provided to the user that the magnet is not operational and needs to be serviced.

Other general system checks that may be performed in accordance with some embodiments include determining the stability of the power supply 112. The inventors have recognized that in some implementations power supply 112 may be operated near the margins of stability, and small deviations outside of this range may cause the power supply to become unstable and oscillate. Power supply 112 may also oscillate for other reasons, including, but not, limited to, a circuit fault inside of the power supply. The stability of the power supply may be determined in any suitable way including, but not limited to, measuring the current drawn from the power supply to ensure that the current being draw is as expected.

The inventors have recognized that the quality of the power source used to power the low-field MRI system 100 may vary depending on the environment in which the low-field MRI system is deployed. For example, a low-field MRI system being operated in the field may be powered by, for example, a generator that may present power source challenges not present when the low-field MRI system is powered using a standard power outlet in a hospital. As another example, the power supply quality may vary with the operation of other devices on the same local power grid. As yet another example, a low-field MRI system deployed in a mobile context, such as in an ambulance, may need to be powered via a battery and converter. To address such issues, some embodiments perform general system checks to assess characteristics of the power source in any suitable way to ascertain whether the power source is of sufficient quality to operate the system.

As another example, low-field MRI systems may be deployed in non-standard environments where the quality and/or standards of the power hook-up may be unknown. To address this, some embodiments include checking the wiring of the power outlet to determine whether the outlet is wired properly prior to trusting the power source to power the system to avoid the power source damaging components of the system. Checking the wiring of the power outlet may include, but is not limited to, measuring the voltage from the power outlet, measuring the noise level in the current provided by the power outlet, and/or determining whether the power outlet is correctly wired (e.g., live, neutral and ground are all at appropriate values). The inventors have appreciated that power produced by some power sources (e.g., a generator or power inverter) may be noisy. If it is determined that the power outlet is not wired properly or has an unacceptable level of noise, the user of the system may be informed, and an alternate power source may be located prior to powering on the low-field MRI system.

The inventors have recognized that external sources of electromagnetic noise may impact the ability of a low-field MRI system to operate properly in the variety of environments that the system may be deployed. Returning to the process of FIG. 3, in act 314, external noise sources are assessed to determine whether detected noise source(s) can be suitably dealt with by modifying one or more operating parameters of the low-field MRI system, whether the noise source can be compensated for using noise compensation techniques, or whether the low-field MRI system will not operate suitably in the presence of one or more detected noise sources, in which case the low-field MRI system should alert an operator that the system should be moved to another location less affected by noise.

According to some embodiments, environmental conditions including, but not limited to, external temperature drift and/or system temperature drift, may be detected and/or monitored, and the carrier frequency (Larmor frequency) of one or more pulse sequences used to perform imaging by the low-field MRI system may be modified to compensate for changes in the environmental conditions. Aspects of the low-field MRI system other than pulse sequence parameters may additionally or alternatively be adjusted or modified to compensate for changes in the environmental conditions. For example, gradient currents or shim currents may also be determined based, at least in part, on detected environmental conditions.

Some low-field MRI systems for use in accordance with some embodiments may include a noise cancellation system configured to detect and, at least partially, compensate for external sources of noise. For example, noise canceling may be performed by providing an auxiliary receive channel to detect ambient radio frequency interference (RFI). For example, one or more receive coils may be positioned proximate to, but outside, the field of view of the $B_0$ field to sample the RFI but not detect MR signals emitted by an object being imaged. The RFI sampled by the one or more auxiliary receive coils may be subtracted from the signal received by the one or more receive coils positioned to detect emitted MR signals. Such an arrangement has the ability to dynamically handle and suppress RFI to facilitate the provision of a generally transportable and/or cartable low field MRI system that likely to be subjected to different and/or varying levels of RFI depending on the environment in which the low field MRI system is operated. Some examples of suitable noise cancellation techniques that may be used with a low-field MRI system are described in co-filed U.S. Application under Ser. No. 14/845,949, titled "Noise Suppression Methods and Apparatus," filed Sep. 4, 2015, which is herein incorporated by reference in its entirety.

Some embodiments may detect and compensate for noise sources using a multichannel receive coil array configured to detect the spatial location of received signals as either being within the array or outside of the array. Signals determined to be from outside of the array may be considered noise and can be subtracted from the signals determined to be from within the array. Noise cancellation techniques in accordance with some embodiments include employing both a multichannel receive coil array and one or more auxiliary coils used to perform noise cancellation.

As another example, the noise cancellation system may detect if there is a nearby device producing electromagnetic noise that will impact the operation of the low-field MRI system, which will enable an operator of the low-field MRI system to determine whether the noisy device can be unplugged or removed prior to operation and/or whether the noisiness introduced by the detected noisy device can be compensated for using any of various noise cancellation techniques. External noise may arise from several different types of sources that interfere with the ability of a low-field MRI system to produce images of an acceptable quality. For example, the low-field MRI system may detect noise in a particular frequency band and configured the low-field MRI system to operate in a different frequency range to avoid the interference. As another example, the low-field MRI system may detect noise sufficient so that the system cannot avoid and/or adequately suppress the noise. For example, if the low-field MRI system is deployed near an AM broadcast station, it may be determined that the noise cancellation system may not be capable of cancelling the broadcast noise, and the user of the low-field MRI system may be informed that the system should be moved to another location away from the AM broadcast station to ensure proper operation of the low-field MRI system.

The inventors have recognized that external signals that may contribute to reduced performance of a low-field MRI system may include signals not often considered to be traditional noise sources. For example, other low-field MRI systems operating in the vicinity of a given low-field MRI system being configured may also generate signals that may interfere and negatively impact the performance of the low-field MRI system. According to some embodiments, the low-field MRI system is configured to detect other systems in close enough proximity to interfere with operation and may communicate with any such system to avoid mutually interfering with each other. For example, multiple low-field MRI systems may be configured to communicate with each other using a networking protocol (e.g., Bluetooth, WiFi, etc.), and other low-field MRI systems operating in the vicinity of the low-field MRI system being configured may be identified by attempting to automatically connect to other low-field MRI systems within range using the networking protocol.

High-field MRI systems are deployed in specialized shielded rooms to prevent electromagnetic interference from impacting operation of the MRI system. As a result, high-field MRI systems are also isolated from external communications. In addition, because of the high-field strengths, electronic devices typically cannot be operated in the same room as the $B_0$ magnet of the MRI system. Low-field MRI systems, on the other hand, can be configured to be generally portable and to operate in locations other than specialized shielded rooms. As a result, low-field MRI systems can be communicatively coupled to other devices, including other low-field MRI systems, in ways that high-field MRI systems cannot, facilitating a number of benefits, some of which are discussed in further detail below.

Figure 5:
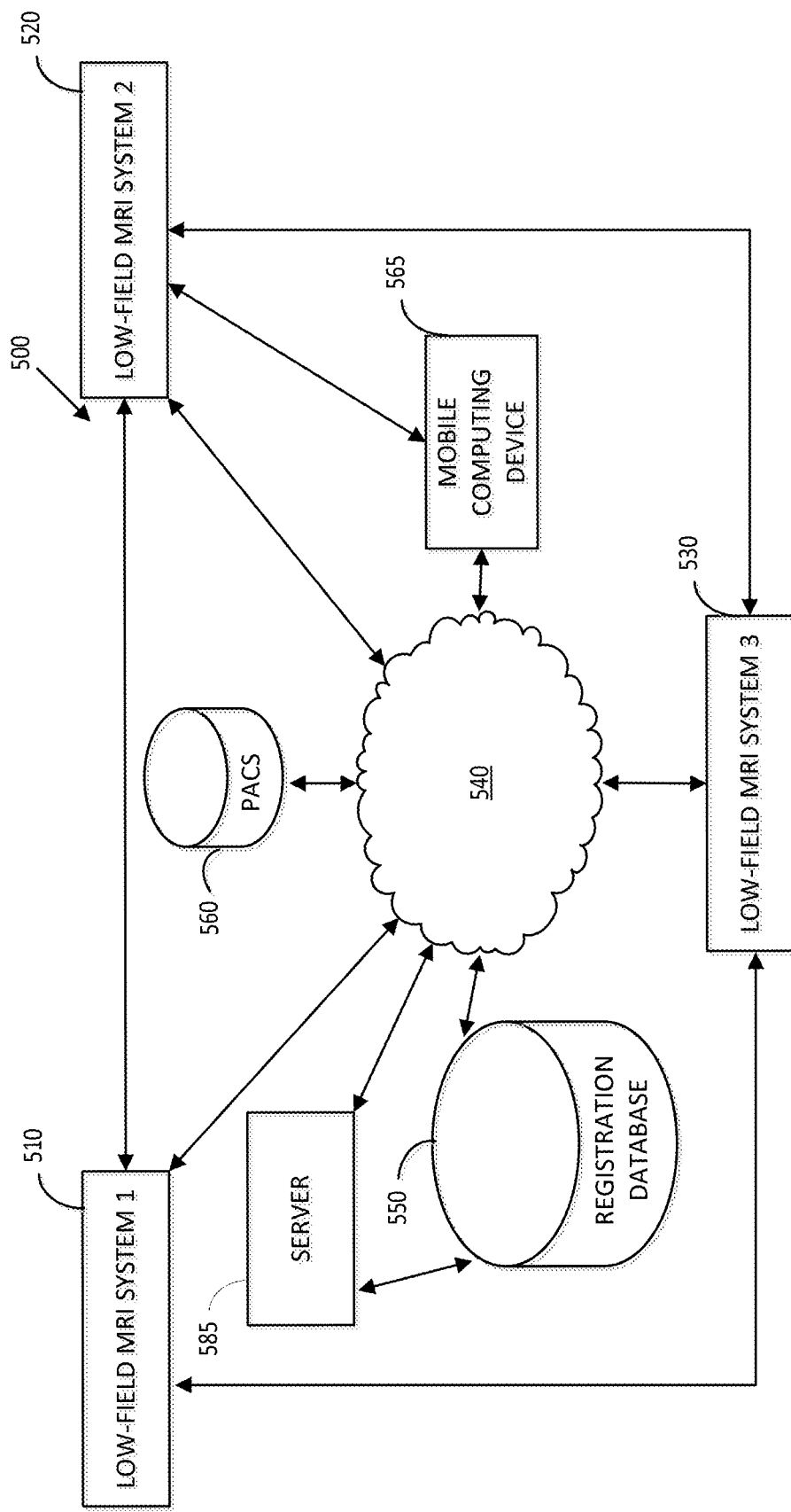
FIG. 5 is a schematic of a networked environment in which some of the techniques described herein may be performed.

FIG. 5 illustrates a networked environment 500 in which one or more low-field MRI systems may operate. For example, multiple low-field MRI systems may be deployed in different rooms of a clinic or hospital, or may be deployed in different facilities remotely located. The systems may be configured to communicate via the network to identify the presence of other systems, and automatically configure the operating conditions of one or more low-field MRI systems with detection capabilities to reduce interference between the systems. As shown, networked environment 500 includes a first low-field MRI system 510, a second low-field MRI system 520, and a third low-field MRI system 530. Each of the low-field MRI systems is configured with detection capabilities to discover the presence of the other low-field MRI systems, either via the network or using any other suitable mechanism (e.g., via device-to-device communication, detection of another low-field MRI system as a noise source, etc.).

In some embodiments, a low-field MRI system may be configured to automatically detect the presence of another operating low-field MRI system by directly communicating with the other operating low-field MRI system. For example, the low-field MRI systems may be configured to communicate with each other using a short-range wireless protocol (e.g., Bluetooth, WiFi, Zigbee), and upon startup, a low-field MRI system may attempt to discover if any other low-field MRI systems are operating nearby using the short-range wireless protocol.

In some embodiments, a low-field MRI system may be configured to automatically detect the presence of another operating low-field MRI system using an indirect technique (i.e., by not communicating directly with the another low-field MRI system), such as by communicating with a central computer, server (e.g., server 585) or intermediary device configured to keep track of the location of systems connected to the network. Any suitable indirect technique may be used. For example, in some embodiments, upon startup and/or sometime thereafter during operation, a low-field MRI system may send one or more messages to database 550 via network 540 to register itself in the database. Registration of a low-field MRI system in database 550 may include providing any suitable information for storage in the database including, but not limited to, an identifier of the low-field MRI system, an operating (e.g., Larmor) frequency of the system, a location of the system, and an indication of whether the system is active or in a standby mode.

The information stored in database 550 may be updated when a low-field MRI system first starts up, when a low-field MRI system changes its operating state (e.g., transitioning from active mode to standby mode), when the system changes one or more parameters (e.g., operating frequency), etc. Upon startup and/or sometime thereafter, a low-field MRI system may send a query to a computer associated with the database (e.g., server 585) to determine whether additional low-field MRI systems are operating nearby and to obtain information about any detected low-field MRI systems. The query may include any suitable information to enable searching database 550 including, but not limited to, an identifier of low-field MRI system issuing the query and a location of the low-field MRI system. The low-field MRI system may subsequently negotiate with other proximate systems, either directly or via the computer, to establish operating parameters such that the systems do not interfere.

In other embodiments, detecting the presence of other nearby low-field MRI systems may be accomplished through measurements of MR data. For example, detected signals in response to RF pulses may be analyzed to identify the presence of noise in the signal characterizing the presence of a nearby low-field MRI system. Such embodiments do not require networked (either direct or indirect) communication between multiple low-field MRI systems. However, data acquisition and the analysis of data is required for the detection process, which may delay the identification of nearby systems.

The inventors have recognized that in implementations where multiple low-field MRI systems are operating in close proximity, the systems may be configured to reduce interference between the systems or reduce the impact of any other noise source (e.g., an AM radio station) on the performance of a low-field MRI system. For example, the $B_0$ field of a first low-field MRI system may be adjusted to shift the Larmor frequency of the system away from the Larmor frequency of a second low-field MRI system operating close by or away from any other frequency range in which noise has been detected. Appropriate operating frequencies and/or field strengths (or any other suitable configuration parameter) to use may be established by negotiation directly between multiple low-field MRI systems or through communication with a central server responsible for resolving conflicts between systems. For example, a computer associated with database 550 may be responsible for assigning operating configuration parameters to closely located low-field MRI systems.

The inventors have recognized that multiple low-field MRI systems may also benefit from being connected to each other using one or more networks by sharing information including, but not limited to, pulse sequences, waveform tables, pulse timing schedules, or any other suitable information. In some embodiments, a potential conflict between multiple low-field MRI systems may be managed by time-slicing operation of the systems to reduce the effect of interference between the systems. For example, a time-sharing arrangement may be established between at least two low-field MRI systems to alternate or otherwise coordinate pulse sequences so that transmit and/or receive cycles are appropriately staggered to reduce interference between the systems.

As shown, the networked environment may also include one or more picture archiving and communication systems (PACS) 560, and a low-field MRI system may be configured to automatically detect and connect to PACS 560 to enable the storage of images captured with the low-field MRI system, to obtain one or more images (or information therefrom) stored by PACS 560, or to otherwise utilize information stored therein. The networked environment may also include a server 585 that can coordinate activity of and/or between low-field MRI systems connected to the network. Server 585 can also serve to provide data to the low-field MRI systems, for example, magnetic resonance fingerprinting data to facilitate MRI using MR fingerprints. Server 585 can also operate as an information resource in other respects.

Returning to the process illustrated in FIG. 3, in act 316, the mechanical configuration of the low-field MRI system is checked. For example, one or more of the mechanical components of the low-field MRI system may comprise a micro-switch, a sensor, or any other suitable device for determining whether one or more mechanical components is properly in place. Examples of mechanical components of a low-field MRI system that may employ measures to ensure that they are properly engaged include, but are not limited to, one or more RF coils (e.g., the head coil), a bed or table on which the patient is placed during imaging, and a breaking device for the low-field MRI system when implemented as a portable system.

According to some embodiments, the exemplary system illustrated in FIG. 2 may include a component that allows different types of transmit/receive coils to be snapped into place to, for example, transmit/receive coils configured to image different portions of the anatomy. In this manner, a head coil, a chest coil, an arm coil, a leg coil or any other coil configured for a particular portion of the anatomy may be snapped into system to perform a corresponding imaging operation. The interface to which the interchangeable coils are connected (e.g., snapped into place) may include a mechanism for detecting when a coil has been correctly attached, and this information may be communicated to an operator of the system. Alternatively, or in addition to, the transmit/receive coil may be configured with a sensor of any suitable type capable of detecting when the coil has been correctly positioned and coupled to the system (e.g., snapped into place). According to some embodiments, the various transmit/receive coils may include a storage device and/or microcontroller that stores information on the coil including, for example, any one or combination of coil type, operating requirements, field of view, number of channels, and/or any other information that may be of use to the system, as discussed in further detail below. The transmit/receive coil may be configured to automatically provide information to the system (e.g., broadcast information) when correctly attached to the system and/or the transmit/receive coil may be configured to provide any requested information in response to a query from the system. Any other components may be checked to make sure all relevant mechanical connections are correctly made, as the aspects are not limited in this respect.

According to some embodiments, the system may automatically select a scanning protocol based on the type of transmit/receive coil that is connected to the system. For example, if it is detected that a head coil is connected, the system may automatically select suitable head imaging protocols. The system may provide a list of available head imaging protocols which is then presented to the user for selection. Alternatively, if the system has further information (e.g., information obtained from an RFID tag associated with the patient, as discussed in further detail below), or information from a patient scheduling system, the system may select a specific head imaging protocol and setup the system to perform the corresponding imaging procedure (e.g., an imaging procedure to check for stroke). Similarly, when multiple protocols are presented and a user selects from the options, the system may setup the system to perform the corresponding imaging procedure. As examples, the system may obtain (e.g., load or create) the appropriate pulse sequence(s), select the appropriate contrast type, select the appropriate field of view, prepare for acquisition of one or more scout images, etc. It should be appreciated that whatever the type of transmit/receive coil detected, the system may present the available protocols and/or prepare and setup the system to perform a selected or automatically identified scanning protocol.

According to some embodiments, the system may automatically select a scanning protocol based on the position of one or more components of the system. For example, the system may detect the position of the patient support (e.g., the bed, table or chair) and automatically select a suitable imaging protocol or present a list of available imaging protocols suitable for the current position of the patient support and/or setup up the system to perform an appropriate imaging procedure. It should be appreciated that automatically selecting appropriate imaging protocol(s) and/or performing other automatic setup activities may be performed based on detecting the position and/or configuration of other components of the system, as the aspects are not limited in this respect.

In act 318, automatic tuning of the RF coil may be performed. Some embodiments may include functionality for automatically detecting the type of connected RF coil, and automatic tuning of the RF coil may be performed based, at least in part, on information for the particular type of connected RF coil that is detected. Other embodiments may not include functionality for automatically detecting a type of connected RF coil, and automatic turning of the RF coil may be performed based, at least in part, on manually entered information about the type of coil currently connected.

Automatic detection of a type of connected RF coil may be implemented in any suitable way. For example, the type of connected RF coil may be based, at least in part, on the wiring in a connector of the coil. As another example, a programmable storage device (e.g., an EPROM) programmed with configuration information for the coil may be included as a portion of the coil, and the configuration information may be downloaded to the low-field MRI system when the coil is connected or at some other time thereafter. The configuration information may include information identifying the RF coil and any other suitable information to facilitate configuration and/or calibration of the RF coil. For example, as discussed above, information about the field of view (FOV) of the coil, the frequency range of the coil, power scaling of the coil, calibration data for the coil, or any other suitable information may be stored on the storage device and, when transferred to the low-field MRI system, may be used to automatically tune the RF coil. As yet another example, the connected RF coil may include an RFID tag that identifies the RF coil as being of a particular type, and the type of coil may be identified by the low-field MRI system based, at least in part, on the RFID tag. The RFID tag may store and provide other information about the corresponding coil, for example, any of the information described in the foregoing. It should be appreciated that any type of device that can store information that is accessible either actively or passively may be utilized, as the aspects are not limited in this respect.

Various aspects of the automatic RF coil configuration may be performed based, at least in part, on data collected during the configuration process. For example, some embodiments may be configured to automatically detect the field of view and/or position of the patient prior to imaging by performing a test localizer pulse sequence and analyzing the MR response. To speed up the configuration process, in some implementations, such a localizer pulse sequence may be performed prior to the magnet completely being warmed up, as discussed above. Appropriate adjustments to the patient and/or components of the low-field MRI system may then be made while the magnet is warming up. However, such pulse sequences can be applied after the magnet is warmed up, as this techniques is not limited for use to any particular point in time.

According to some embodiments, the field of view and/or center position is determined by acquiring a low resolution image to find the spatial extent of the subject. Alternately, the spatial extent may be obtained by acquiring signal projections through the subjects. Adjustments may be made to the system based on detecting where the subject is located within the field of view, or a warning message may be provided if the subject is outside of the field of view to an extent that cannot be adjusted or compensated for. One or more fast scout images may be obtained using the field of view and/or center position. This scout image can be utilized in a number of ways to facilitate the imaging procedure. For example, the user can select a scan volume by dragging a box over a desired portion of the scan image or otherwise annotating the scout image to indicate a desired region at which to perform image acquisition. Alternatively, the user can zoom in or out (e.g., using a zoom tool, using gestures on a touch screen, etc.) to select the scan volume at which to perform a higher or full resolution scan. According to some embodiments, a scout image may be displayed with the position of one or more receive coils superimposed on the image. This information can be utilized to determine if a patient is positioned within the field of view to satisfactorily image the target portion of the anatomy.

According to some embodiments, the spatial extent may be determined using other techniques, for example, using one or more optical cameras. Information obtained from one or more optical cameras can be used to assess where a patient is located and whether the patient is positioned in a manner suitable for imaging.

Returning to the process of FIG. 3, in act 320, automatic shimming is performed. As discussed above, some low-field MRI systems for use with the techniques described herein include one or more shim coils that may be energized to adjust the $B_0$ field to account for inhomogeneities in the field. In some embodiments that include shim coils, calibration of the $B_0$ field may be performed in a similar manner by selectively activating shim coils to improve the homogeneity of the $B_0$ field. According to some embodiments, one or more sensors are used to determine system characteristics (e.g., homogeneity of a magnetic field, stability of the system) and/or characteristics of environmental noise, and the information from the sensors may be used to tune the magnetic field by adjusting the operating parameters of the magnetics, including, but not limited to, adjusting the B0 magnet, selecting one or more shim coils to operate and/or selecting the operating parameters of the one or more shim coils.

In some embodiments, automatic shimming is performed only after the magnet has warmed up completely. In other embodiments, automatic shimming is performed during the warm up process, as needed to acquire images before the magnet has warmed up completely. Automatic shimming may be performed using a pre-defined sequence or in response to measurements of the $B_0$ field, as aspects of the invention are not limited in this respect. Additionally, automatic shimming may be performed upon startup and/or at any other suitable intervals while the low-field MRI system is in use. Dynamic adjustment of the $B_0$ field by using automatic shimming periodically or continuously during operation may facilitate the acquisition of higher quality images in environments with changing properties, noise levels and/or under circumstances where the magnet temperature fluctuates, either during operation or because the magnet has not reached thermal equilibrium.

According to some embodiments, a low-field MRI system may include field sensors arranged to obtain local magnetic field measurements in connection with magnetic fields generated by a low-field MRI system and/or magnetic fields in the environment. These magnetic field measurements may be used to dynamically adjust various properties, characteristics and/or parameters of the low-field MRI system to improve the performance of the system. For example, a network of spatially distributed field sensors may be arranged at known locations in space to enable real-time characterization of magnetic fields generated by a low-field MRI system. The network of sensors are capable of measuring local magnetic fields of the low-field MRI system to provide information that facilitates any number of adjustments or modifications to the system, some examples of which are described in further detail below. Any type of sensor that can measure magnetic fields of interest may be utilized. Such sensors can be integrated within one or more laminate panels or may be provided separately, as concepts related to using magnetic field measurements are not limited to the type, number or method of providing the sensors.

According to some embodiments, measurements provided by a network of sensors provides information that facilitates establishment of suitable shimming to provide a $B_0$ field of desired strength and homogeneity. As discussed above, any desired number of shim coils of any geometry and arrangement can be integrated in a laminate panel, either alone or in combination with other magnetic components, such that different combinations of shim coils may be selectively operated and/or operated at desired power levels. As such, when a low-field MRI system is operated in a particular environment, measurements from the network of field sensors may be used to characterize the magnetic field generated by, for example, a $B_0$ magnet and/or gradient coils, to determine what combination of shim coils should be selected for operation and/or at what power levels to operate selected shim coils to affect the magnetic fields such that the low-field MRI system produces a $B_0$ field at the desired strength and homogeneity. This capability facilitates the deployment of generally portable, transportable and/or cartable systems as the $B_0$ field can be calibrated for a given location at which the system is being utilized.

According to some embodiments, measurements from the network of field sensors may be utilized to perform dynamic shimming during operation of the system. For example, the network of sensors may measure magnetic fields generated by a low-field MRI system during operation to provide information that can be used to dynamically adjust (e.g., in real-time, near real-time or otherwise in conjunction with operating the system) one or more shim coils and/or operate a different combination of shim coils (e.g., by operating one or more additional shim coils or ceasing operation of one or more shim coils) so that the magnetic fields generated by the low-field MRI system have or are closer to having desired or expected characteristics (e.g., the resulting $B_0$ field is produced at or closer to desired field strength and homogeneity). Measurements from a network of field sensors may also be utilized to notify an operator that magnetic field quality (e.g., the $B_0$ field, gradient fields, etc.) fails to meet a desired criteria or metric. For example, an operator may be alerted should the $B_0$ field being generated fail to meet certain requirement regarding field strength and/or homogeneity.

According to some embodiments, measurements from a network of sensors may be used to guide and/or correct reconstruction and/or processing of MR data obtained from operating the low-field MRI scanner. In particular, actual spatial-temporal magnetic field patterns obtained by the sensor network may be used as knowledge when reconstructing images from the acquired MR data. As a result, suitable images may be reconstructed even in the presence of field inhomogeneity that would otherwise be unsatisfactory for acquiring data and/or producing images. Accordingly, techniques for using field sensor data to assist in image reconstruction facilitates obtaining improved images in some circumstances and enabling the performance of low-field MRI in environments and/or circumstances where field strength and/or homogeneity is degraded.

According to some embodiments, a network of field sensors may be used to measure and quantify system performance (e.g., eddy currents, system delays, timing, etc.) and/or may be used to facilitate gradient waveform design based on the measured local magnetic fields, etc. It should be appreciated that measurements obtained from a network of field sensors may be utilized in any other manner to facilitate performing low-field MRI, as the aspects are not limited in this respect. In generally portable, transportable or cartable systems, the environment in which the MRI system is deployed may be generally unknown, unshielded and generally uncontrolled. As such, the ability to characterize the magnetic fields generated by a low-field MRI system given a particular environment (magnetic and otherwise) facilitates the ability to deploy such systems in a wide range of environments and circumstances, allowing for the systems to be optimized for a given environment.

According to some embodiments, one or more measurements made by the low-field MRI system may be used in addition to or as a substitute for a network of field sensors, as discussed above. Substituting the use of MR-based measurements made by the low-field MRI system for measurements made by a network of field sensors may simplify the design of the low-field MRI system and enable the production of low-field MRI systems with a reduced cost.

In some embodiments, a low-field MRI system may send diagnostic information to a centralized location (e.g., one or more networked connected computers associated with database 550) prior to determining that the system is ready for imaging a patient. In this manner, the low-field MRI system may connect to the cloud to exchange information prior to imaging or at any time during setup, configuration and/or operation. The transmitted diagnostic information may be analyzed at the centralized location and if it is determined that the low-field MRI system is functioning properly, a message may be sent back to the system to inform the user that the system is ready for imaging. However, if a problem is detected in response to analyzing the transmitted information, information indicating that the system may have an operating problem may be sent back to the system. The information returned to the low-field MRI system may take any form including, but not limited to, a simple ready/not ready indication, and a detailed analysis of the detected problem, if found. In some embodiments, the information transmitted back to the low-field MRI system merely indicates that the low-field MRI system is in need of servicing.

According to some embodiments, diagnostic information provided may include a current version of software installed on the low-field MRI system. From this information, a determination that the MRI system is operating using an up-to-date version of the software may be made. If it is determined that the current version of the software installed on the low-field MRI system is not up-to-date, the information sent back to the MRI system may include an indication that the software should be updated. In some embodiments, the ability to operate the low-field MRI system may be restricted based on the importance of the software update. According to some embodiments, an up-to-date version of the software may be downloaded from a cloud connected computer to dynamically update the system when it is detected that the system is not using the most recent version of the software and/or is otherwise operating using old and/or outdated software.

Some embodiments may be configured to provide dynamic configuration of the MRI system by enabling the console to adjust the way that MRI sequences are used to generate images of a desired quality and resolution. Conventional MRI consoles typically operate by having a user select a pre-programmed MRI pulse sequence, which is then used to acquire MR data that is processed to reconstruct one or more images. A physician may then interpret the resulting one or more images. The inventors have recognized and appreciated that operating MRI systems using pre-programmed MRI pulse sequences may not be effective at producing an image of a desired quality. Accordingly, in some embodiments, a user may prescribe the type of image to acquire, and the console may be tasked with deciding on the initial imaging parameters, optionally updating the parameters as the scan progresses to provide the desired type of image based on analyzing the MR data received. Dynamically adjusting imaging parameters based on computational feedback facilitates the development of a "push-button" MRI system, where a user can select a desired image or application, and the MRI system can decide on a set of imaging parameters used to acquire the desired image, which may be dynamically optimized based on MR data obtained during acquisition.

Returning the process of FIG. 3, in act 322, external electronic devices (e.g., external electronic device 585 illustrated in FIG. 5) may be detected. The inventors have recognized that the use of low-field MRI systems permit patients, medical practitioners, and others to have and use electronic devices 460 in close proximity to the MRI system without the safety concerns that arise when such devices are located in close proximity to high-field MRI systems. One such class of external electronic devices are wearable electronics (e.g., smartwatches, sensors, monitors, etc.) that may be used safely in low-field environments. Wearable electronics may store and/or detect patient data that may facilitate the acquisition of images using the low-field MRI system. Accordingly, some embodiments automatically detect the presence of such electronic devices and download patient data (e.g., heart rate, breathing rate, height, weight, age, patient identifier, etc.) to the low-field MRI system for use in acquiring imaging data. For example, the patient data may be used to gate or modify one or more data acquisition parameters (e.g., pulse sequences) to customize the data acquisition process based on a particular individual's patient-specific data.

The patient data may also be used to select appropriate pulse sequences or other operational parameters of the low-field MRI system from a set of possible pulse sequences or operational parameters. Alternatively, the patient data may be used for any other purpose to improve imaging by the low-field MRI system. For example, heart rate data and/or breathing rate data received from a wearable electronic device may be used to mitigate and/or correct for motion artifacts caused by patient motion. In addition, physiological data such as heart rate or breathing rate may be used to provide synchronization information for an imaging process Wearable electronic devices may be detected in any suitable way using any suitable wireless discovery technique, examples of which are known.

A wearable device may include an RFID tag that includes patient data such as demographic information, health information about the patient (e.g., whether the patient has a pacemaker, implant, etc.), information regarding the imaging protocol for the patient, etc. This information may be used by the system to automatically prepare and/or setup up the system to perform imaging according to the appropriate protocol. For example, the system may perform one or more checks to make sure the system is appropriately configured (e.g., a correct transmit/receive coil is connected to the system, bed is in an appropriate position, etc.) for the desired imaging procedure, may select the appropriate pulse sequence, automatically configure one or more parameters of the system, prepare to acquire one or more scout images and/or automatically perform any other suitable procedure to prepare for acquiring image(s) according to the desired protocol. The information obtained from the RFID tag may include any other information including, but not limited to, contrast agent type, amount, etc., destination of acquired images (e.g., PACS, cloud, tele-radiologist, centralized server, etc.) and/or any other information that facilitates the imaging procedure.

It should be appreciated that any of the above described information may be obtained by the system using other techniques, such as scanning a bar code or hospital tag, or obtaining information available on the patient's mobile device such as a smart phone or wearable device, as automatically obtaining information about the patient and/or the desired imaging procedure is not limited for use to any particular technique. For example, a patient's mobile device (e.g., a smart phone, wearable device, etc.) may include health information, diagnostic information or other information that may be accessed and utilized to obtain information that can inform aspects of automatically setting up an imaging protocol and/or imaging procedure.

The inventors have also recognized that some external electronic devices (e.g., a mobile computing device) may be used to control various operational aspects of the low-field MRI system. For example, rather than requiring a healthcare professional to control the low-field MRI system from a dedicated console, some embodiments allow an external electronic device such as a smartphone or a tablet computer to control operation of the low-field MRI system. The electronic device may be programmed with control instructions (e.g., using a control application) that, when within range of a low-field MRI system, enable a user of the electronic device to control at least some operations of the system. Accordingly, some low-field MRI systems for use in accordance with some of the techniques described herein may be configured to automatically detect the presence of external electronic devices that can be used to remotely control at least some operations of the low-field MRI system. Additionally, one or more applications installed on the external electronic device may also include instructions that enable the healthcare professional using the device to access and view one or more images stored on PACS 560.

As discussed above, an imaging procedure may be controlled using any number of local or remote devices, including a user's mobile device, a computer local to a tele-radiologist, a local and/or integrated computer at the system, etc. The inventors have appreciated that whatever device is utilized, the user interface functionality may be implemented to facilitate the examination process. For example, during an examination process, areas of interest may be selected via one or more scout images or via or more higher resolution images, and additional scans may be automatically performed to acquire further images corresponding to the selected areas of interest. According to some embodiments, to assist a local user and/or tele-radiologist, previously obtained images of the subject may be displayed and/or reference images of expected or healthy anatomy/tissue may be displayed. Previously obtained images may be used as a comparison to identify anomalous regions, monitor changes in the patient (e.g., to determine efficacy of a treatment), or otherwise provide diagnostic assistance. Reference images may be used to assist in identifying abnormal anatomy, anomalous tissue and/or identify any other condition that deviates from expectation as characterized by the references images.

The inventors have further appreciated that automatic analysis on obtained images may be performed to detect various events, occurrences or conditions. For example, poor image quality in one or more areas may be detected and appropriate pulse sequences obtained to acquire further image data to fill in the gaps, increase the signal-to-noise ratio and/or or to otherwise obtain higher quality image data and/or improve the image quality in the selected areas. As another example, acquired images may be analyzed to detect when target anatomy is not adequately captured in the acquired images and warn the user that further imaging may need to be performed.

The configuration operations of FIG. 3, discussed above, have been described primarily in the context of configuring a low-field MRI system during initial system startup. However, it should be appreciated that one or more of the configuration operations may additionally or alternatively be performed automatically during operation of the low-field MRI system. As an example, the temperature of the magnet may be monitored during system operation using a temperature sensor or by measuring the voltage of the magnet as described above. The magnet voltage/temperature may also be monitored during operation to assess whether components of the thermal management system (e.g., pumps, fans, etc.) are working properly. Additionally, one or more components of the thermal management system may be directly monitored during operation of the low-field MRI system to ensure that the components of the low-field MRI system are being cooled properly, as desired.

To reduce the power consumption of the low-field MRI system during operation, a control application executing on the console of the system may monitor for user activity. When no user activity is detected for a particular amount of time (e.g., 30 minutes, 1 hour), the low-field MRI system may automatically enter a low-power mode to reduce power consumption and/or operational burden on the components that could shorten the effective lifetime of the equipment. According to some embodiments, a low-field MRI system may have multiple low-power modes representing different states of user inactivity, and the low-field MRI system may transition between the different low-power modes rather than completely shutting down upon not detecting user activity. For example, the low-field MRI system may be configured to have three low-power modes, each of which corresponds to a different state of maintaining the magnet at a desired power and temperature. Upon detection of user inactivity for a short period of time (e.g., 30 minutes), the magnet may automatically enter a "light" low-power mode in which the current provided to the magnet is decreased slightly to reduce power consumption. If user inactivity is detected for a longer period of time (e.g., 1 hour), the magnet may automatically transition into a "medium" low-power mode, where the current provided to the magnet is decreased further to consume less power. If user inactivity is detected for an even longer period of time (e.g., 4 hours), the magnet may automatically transition into a "deep" low-power mode, where the current provided to the magnet is decreased even further to consume fewer power resources.

As the magnet cools in the different low-power modes, components of the thermal management system (e.g., fans, pumps) may be adjusted accordingly. Although three different low-power modes are described above, it should be appreciated that any suitable number of low-power modes (including zero or one low-power mode) may alternatively be used. In addition, the time periods given above are merely exemplary and any time period can serve as a basis for triggering a transition to a low power mode. Moreover, other aspect of the system may be monitored and/or other events may be used to trigger a transition to a low-power mode, as automated transition to a low power mode is not limited to any particular type of trigger.

In accordance with some embodiments, a user may interact with a control application to place the magnet into a low-power mode rather than relying on automated processes (e.g., the detection of user inactivity). A return to normal operation of the low-field MRI system from a low-power mode may be initiated in response to the detection of user activity, such as receiving control instruction via a control application on the console (e.g., a user engaging with a user interface control on the console), via external electronic device communicating with the low-field MRI system, or in any other suitable way.

The inventors have recognized that objects in the environment near the low-field MRI system may become magnetized over time if the polarity of the $B_0$ field remains constant, and the magnetization of the objects in the environment may cause distortions (e.g., an offset) in the $B_0$ field, resulting in poorer image quality. Demagnetizing the environmental objects may comprise performing a degaussing process in which the magnetization in the object is reduced. Some embodiments are directed to the reducing the source of magnetization rather than treating its effects. For example, some low-field MRI systems may be configured to switch the polarity of the $B_0$ field occasionally (e.g., once a day) to prevent magnetization of objects in the surrounding environment. In embodiments in which the polarity of the $B_0$ field is periodically switched, the automatic shimming process, described above may take into account the current polarity of the $B_0$ field to perform accurate shimming.

According to some embodiments, ferromagnetic components are used to increase the field strength of a $B_0$ magnet without requiring additional power or producing a same $B_0$ field using a reduce amount of power. Such ferromagnetic components may become magnetized as a result of operating the low-field MRI system and may do so relatively rapidly, thereby perturbing the $B_0$ field in undesirable ways (i.e., differently than intended). Accordingly, the above describe degaussing techniques (e.g., switching the polarity of the B0 magnet) may be used to prevent magnetization of ferromagnetic components from adversely affecting the $B_0$ field and consequently the operation of the low-field MRI system. As discussed above, low-field MRI facilitates the design and development of MRI systems that are generally not feasible in the context of high-field MRI, for example, relatively low-cost, reduced footprint and/or generally portable or transportable MRI systems.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method of operating a magnetic resonance imaging (MRI) system comprising a $B_0$ magnet and at least one thermal management component configured to transfer heat away from the $B_0$ magnet during operation using fluid coolant, the method comprising:
   providing, using a power supply, operating power to the $B_0$ magnet;
   powering up the MRI system, the powering up comprising:
      monitoring, using a temperature sensor and/or a voltage sensor, a temperature of the $B_0$ magnet to determine a current temperature of the $B_0$ magnet; and
      when the current temperature of the $B_0$ magnet is below a first threshold temperature value, operating the at least one thermal management component at less than operational capacity in response to an occurrence of at least one event to reduce a time needed for the $B_0$ magnet to be ready for imaging, wherein the at least one event comprises powering up the MRI system;
      wherein the at least one thermal management component comprises at least one conduit configured to circulate fluid coolant to transfer heat away from the $B_0$ magnet during operation;
      wherein operating the at least one thermal management component at less than operational capacity comprises operating the $B_0$ magnet using a reduced amount of current to reduce power consumption in a low power mode; and
   after powering up the MRI system, acquiring at least one image using the MRI system.

2. The method of claim 1, wherein monitoring the temperature of the $B_0$ magnet comprises using the temperature sensor to monitor the temperature.

3. The method of claim 1, wherein monitoring the temperature of the $B_0$ magnet comprises measuring a voltage associated with the $B_0$ magnet using the voltage sensor.

4. The method of claim 1, wherein the first threshold value corresponds to a thermal equilibrium and/or a $B_0$ field stability of the $B_0$ magnet.

5. The method of claim 1, further comprising determining fluctuations in at least one parameter of the magnetic resonance imaging system, and wherein acquiring the at least one image comprises compensating for the determined fluctuations in the at least one parameter.

6. The method of claim 5, wherein the at least one parameter is a Larmor frequency of the $B_0$ magnet and/or a homogeneity of the $B_0$ field produced by the $B_0$ magnet.

7. The method of claim 5, wherein determining fluctuations in the at least one parameter comprises determining fluctuations based, at least in part, on the current temperature of the $B_0$ magnet.

8. The method of claim 7, wherein monitoring the temperature of the $B_0$ magnet comprises measuring a voltage associated with the $B_0$ magnet using the voltage sensor, and wherein determining fluctuations in the at least one parameter comprises determining the fluctuations based, at least in part, on the measured voltage of the $B_0$ magnet.

9. The method of claim 1, wherein the magnetic resonance imaging system further comprises at least one gradient coil, and wherein the method further comprises modifying an operating state of the at least one gradient coil in response to the occurrence of the at least one event.

10. The method of claim 9, wherein modifying the operating state of the at least one gradient coil comprises providing operating power to the at least one gradient coil.

11. The method of claim 9, wherein modifying the operating state of the at least one gradient coil comprises reducing operating power provided to the at least one gradient coil.

12. The method of claim 1, further comprising operating the $B_0$ magnet to produce at least a portion of a $B_0$ field suitable for low-field magnetic resonance imaging.

13. A magnetic resonance imaging (MRI) system, comprising:
   a $B_0$ magnet configured to provide at least a portion of a $B_0$ field;
   at least one thermal management component configured to transfer heat away from the $B_0$ magnet during operation using fluid coolant;
   a temperature sensor and/or a voltage sensor configured to monitor a temperature of the $B_0$ magnet; and
   at least one processor programmed to:
      during powering up of the MRI system:
         obtain a current temperature of the $B_0$ magnet using the temperature sensor and/or the voltage sensor;
         when the current temperature of the $B_0$ magnet is below a first threshold temperature value,
         operate the at least one thermal management component at less than operational capacity in response to an occurrence of at least one event to reduce a time needed for the $B_0$ magnet to be ready for imaging, and wherein the at least one thermal management component comprises at least one conduit configured to circulate fluid coolant to transfer heat away from the $B_0$ magnet during operation, wherein the at least one event comprises powering up the MRI system, and wherein operating the at least one thermal management component at less than operational capacity comprises operating the $B_0$ magnet using a reduced amount of current to reduce power consumption in a low power mode; and
      after powering up the MRI system, cause the MRI system to acquire at least one image.

14. The magnetic resonance imaging system of claim 13, further comprising at least one gradient coil, and wherein the at least one processor is further programmed to control an operating state of the at least one gradient coil based, at least in part, on the current temperature of the $B_0$ magnet.

15. The magnetic resonance imaging system of claim 13, further comprising at least one radio frequency coil configured to provide a $B_1$ field, and wherein the at least one processor is further programmed to control an operating state of the at least one radio frequency coil based, at least in part, on the current temperature of the magnet.

16. The magnetic resonance imaging system of claim 13, further comprising at least one shim coil, and wherein the at least one processor is further programmed to control an operating state of the at least one shim coil based, at least in part, on the current temperature of the $B_0$ magnet.

17. The magnetic resonance imaging system of claim 13, wherein the $B_0$ magnet is configured to provide a $B_0$ field suitable for low-field magnetic resonance imaging.

* * * * *